US012482727B2

(12) United States Patent
Takahashi

(10) Patent No.: US 12,482,727 B2
(45) Date of Patent: Nov. 25, 2025

(54) SEMICONDUCTOR DEVICE MANUFACTURING METHOD AND SEMICONDUCTOR DEVICE

(71) Applicant: FUJI ELECTRIC CO., LTD., Kawasaki (JP)

(72) Inventor: Yoshiaki Takahashi, Nagano (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 423 days.

(21) Appl. No.: 17/896,780

(22) Filed: Aug. 26, 2022

(65) Prior Publication Data

US 2023/0115598 A1 Apr. 13, 2023

(30) Foreign Application Priority Data

Oct. 13, 2021 (JP) .................................. 2021-168167

(51) Int. Cl.
*H01L 23/495* (2006.01)
*H01L 21/56* (2006.01)
(Continued)

(52) U.S. Cl.
CPC ........ *H01L 23/49513* (2013.01); *H01L 21/56* (2013.01); *H01L 23/293* (2013.01);
(Continued)

(58) Field of Classification Search
CPC ................... H01L 23/49513; H01L 23/49503
See application file for complete search history.

(56) References Cited

U.S. PATENT DOCUMENTS

2010/0097431 A1\* 4/2010 Takakuwa ............ B41J 2/14233
347/68
2011/0037153 A1\* 2/2011 Zhu ........................ H01L 24/83
257/676

(Continued)

FOREIGN PATENT DOCUMENTS

JP H05047810 A 2/1993
JP H10-321666 A 12/1998
(Continued)

OTHER PUBLICATIONS

Japanese Patent Office Action issued for corresponding JP Patent Application No. 2021-168167 on Aug. 5, 2025.

*Primary Examiner* — Yu-Hsi D Sun
(74) *Attorney, Agent, or Firm* — Rabin & Berdo, P.C.

(57) ABSTRACT

A semiconductor device manufacturing method includes preparing a semiconductor chip and a conductive plate having a front surface that includes a disposition area on which the semiconductor chip is to be disposed, forming a supporting portion in a periphery of the disposition area of the conductive plate such that the supporting portion protrudes from a bottom of the disposition area in an upward direction orthogonal to the front surface of the conductive plate, bonding the semiconductor chip to the disposition area via bonding material applied to the disposition area, coating the front surface of the conductive plate, including the semiconductor chip and the supporting portion, with a coating layer, and after the coating, sealing the front surface of the conductive plate, including the semiconductor chip and the supporting portion, with sealing material.

21 Claims, 24 Drawing Sheets

(51) Int. Cl.
*H01L 23/00* (2006.01)
*H01L 23/29* (2006.01)
*H01L 23/31* (2006.01)
*H01L 23/498* (2006.01)

(52) U.S. Cl.
CPC .... *H01L 23/3135* (2013.01); *H01L 23/49822* (2013.01); *H01L 24/29* (2013.01); *H01L 24/83* (2013.01); *H01L 24/45* (2013.01); *H01L 24/48* (2013.01); *H01L 24/73* (2013.01); *H01L 2224/29109* (2013.01); *H01L 2224/29111* (2013.01); *H01L 2224/29113* (2013.01); *H01L 2224/29117* (2013.01); *H01L 2224/29118* (2013.01); *H01L 2224/2912* (2013.01); *H01L 2224/29138* (2013.01); *H01L 2224/29139* (2013.01); *H01L 2224/29147* (2013.01); *H01L 2224/29155* (2013.01); *H01L 2224/29157* (2013.01); *H01L 2224/45124* (2013.01); *H01L 2224/45147* (2013.01); *H01L 2224/48225* (2013.01); *H01L 2224/73265* (2013.01); *H01L 2224/83801* (2013.01)

(56) References Cited

U.S. PATENT DOCUMENTS

| | | | |
|---|---|---|---|
| 2012/0208324 A1* | 8/2012 | Harata | H01L 23/28 438/123 |
| 2016/0276249 A1 | 9/2016 | Okada | |
| 2019/0164807 A1* | 5/2019 | Wachtler | H01L 23/49513 |
| 2021/0305175 A1 | 9/2021 | Abe et al. | |

FOREIGN PATENT DOCUMENTS

| | | |
|---|---|---|
| JP | H11-145363 A | 5/1999 |
| JP | 2005302835 A | 10/2005 |
| JP | 2016174053 A | 9/2016 |
| JP | 2018-207002 A | 12/2018 |
| JP | 2019-071502 A | 5/2019 |
| WO | 2020/017574 A1 | 1/2020 |

\* cited by examiner

SEMICONDUCTOR DEVICE MANUFACTURING METHOD AND SEMICONDUCTOR DEVICE

CROSS-REFERENCE TO RELATED APPLICATION

This application is based upon and claims the benefit of priority of the prior Japanese Patent Application No. 2021-168167, filed on Oct. 13, 2021, the entire contents of which are incorporated herein by reference.

BACKGROUND OF THE INVENTION

1. Field of the Invention

The embodiments discussed herein relate to a semiconductor device manufacturing method and a semiconductor device.

2. Background of the Related Art

Semiconductor devices include power devices and are used as power conversion devices. These power devices include semiconductor chips, such as insulated gate bipolar transistors (IGBTs) and power metal-oxide-semiconductor field-effect transistors (MOSFETs). Such a semiconductor device includes, at least, a semiconductor chip and an insulating circuit board on which the semiconductor chip is disposed. The semiconductor chip is bonded to a circuit pattern included in the insulating circuit board via bonding material (for example, solder). The semiconductor device includes a case that stores the insulating circuit board on which the semiconductor chip is disposed and sealing material that seals the case. This case includes an external connection terminal having, at an end portion thereof, a connection portion electrically connected to the insulating circuit board in the case. The connection portion of the external connection terminal is also sealed by the sealing material in the case. In addition, there are cases in which coating material (coating layer) is applied to the inside of the case before the case is sealed by the sealing material. The coating layer improves the adhesion between the components in the case and the sealing material and prevents peeling of the sealing material.

See, for example, Japanese Laid-open Patent Publication No. 2019-071502

If a semiconductor chip is bonded to a circuit pattern of an insulating circuit board of a semiconductor device via solder, a cavity could be formed in the solder. For example, the cavity is formed to extend from a side portion of the solder between the circuit pattern and the semiconductor chip into the inside of the solder. That is, the cavity is formed under the semiconductor chip. In this case, if the semiconductor chip is sealed by sealing material, the sealing material flows into the cavity under the semiconductor chip. If this semiconductor device is repeatedly heated or cooled, the sealing material under the semiconductor chip expands or contracts. Thus, the semiconductor chip could be subjected to stress and damaged. As a result, the reliability of the semiconductor device is deteriorated.

SUMMARY OF THE INVENTION

In one aspect of the embodiments, there is provided a semiconductor device manufacturing method, including: preparing a semiconductor chip and a conductive plate having a front surface that includes a disposition area on which the semiconductor chip is to be disposed; forming a supporting portion in a periphery of the disposition area of the conductive plate such that the supporting portion protrudes from a bottom of the disposition area in an upward direction orthogonal to the front surface of the conductive plate; bonding the semiconductor chip to the disposition area via bonding material applied to the disposition area; coating the front surface of the conductive plate, including the semiconductor chip and the supporting portion, with a coating layer; and after the coating, sealing the front surface of the conductive plate, including the semiconductor chip and the supporting portion, with sealing material.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Hereinafter, embodiments will be described with reference to the accompanying drawings. In the following description, regarding a semiconductor device in an individual drawing, terms "front surface" and "top surface" each mean an X-Y plane facing upward (+Z direction). Likewise, regarding the semiconductor device in the individual drawing, a term "up" means an upward direction (+Z direction). In addition, regarding the semiconductor device in the individual drawing, terms "rear surface" and "bottom surface" each mean an X-Y plane facing downward (-Z direction). Likewise, regarding the semiconductor device in the individual drawing, a term "down" means a downward direction (-Z direction). The above terms mean their respective directions in the other drawings, too, as needed. Regarding the semiconductor device in the individual drawing, a term "at a higher level" means a higher location (+Z direction). Likewise, regarding the semiconductor device in the individual drawing, a term "at a lower level" means a lower location (-Z direction). The terms "front surface", "top surface", "up", "rear surface", "bottom surface", "down", and "side surface" are only expressions used for the purpose of convenience to determine relative positional relationships and do not limit the technical concept of the embodiments. For example, the terms "up" and "down" may mean directions other than the vertical directions with respect to the ground. That is, the directions expressed by "up" and "down" are not limited to the directions corresponding to the gravitational force. In the following description, when a component contained in material represents 80 vol % or more of the material, this component will be referred to as the "main component" of the material.

First Embodiment

Figure 1:
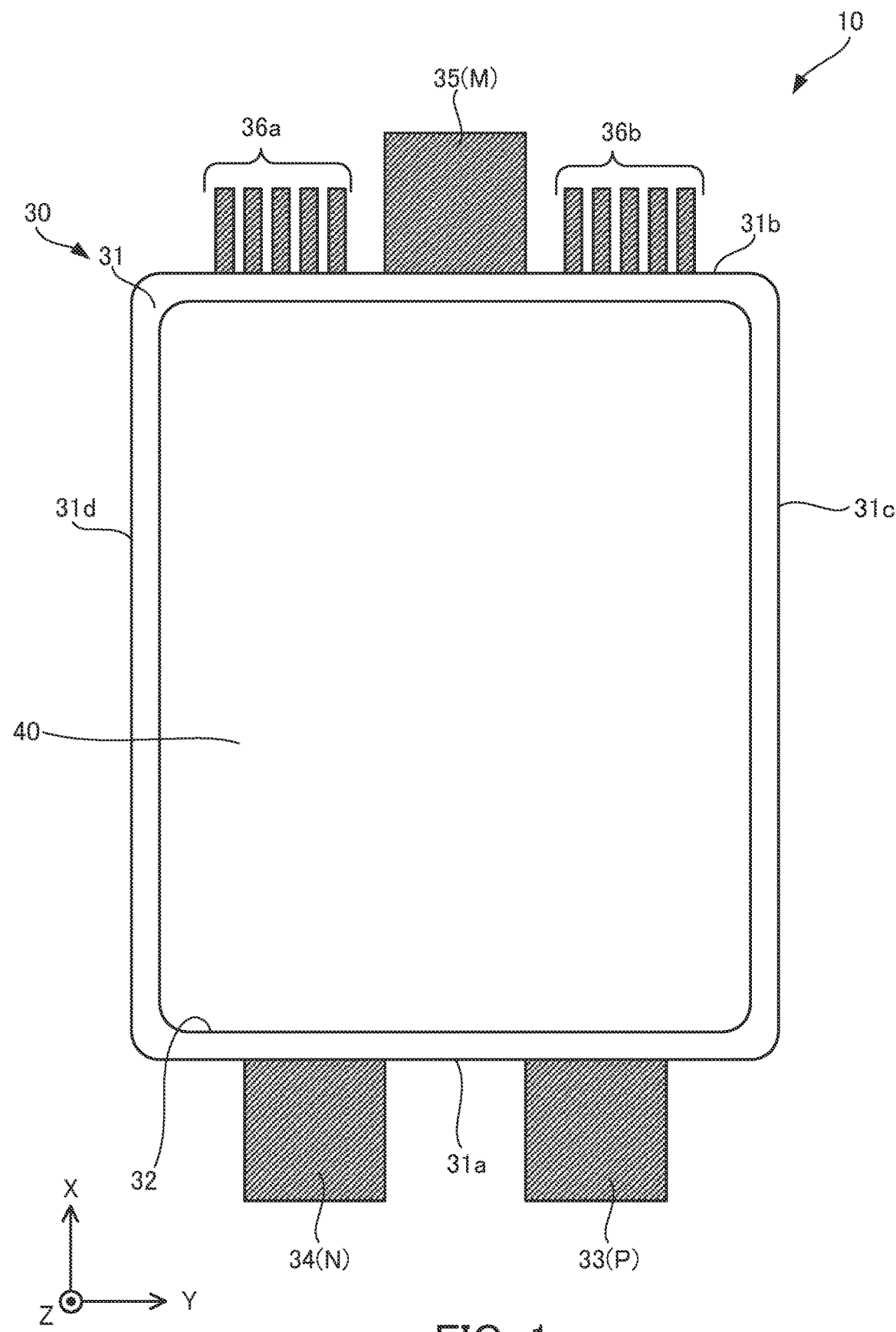
FIG. 1 is a plan view of a semiconductor device according to a first embodiment.
Figure 2:
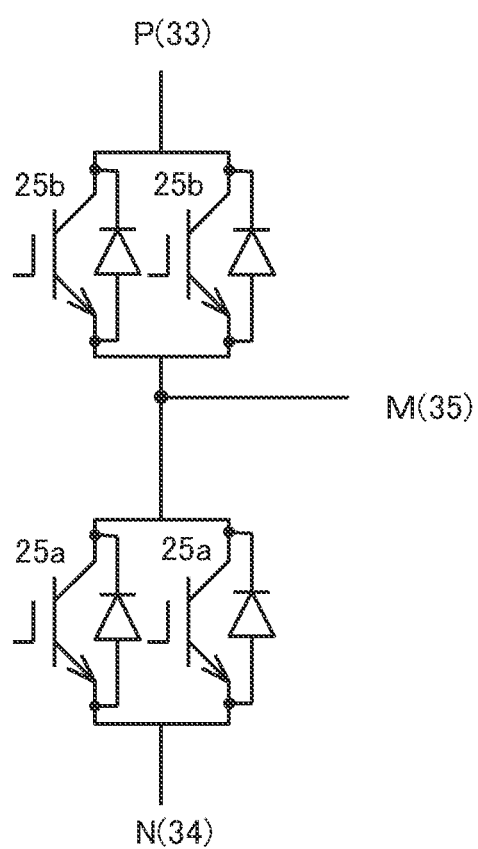
FIG. 2 is a circuit diagram of an equivalent circuit included in the semiconductor device according to the first embodiment.

A semiconductor device according to a first embodiment will be described with reference to FIGS. 1 and 2. FIG. 1 is a plan view of the semiconductor device according to the first embodiment, and FIG. 2 is a circuit diagram of an equivalent circuit included in the semiconductor device according to the first embodiment. In FIG. 1, only some of the main components are denoted by reference characters.

As illustrated in FIG. 1, this semiconductor device 10 includes a semiconductor unit (not illustrated), a case 30 storing the semiconductor unit, and sealing material 40 sealing the semiconductor unit. The semiconductor device 10 may further include a heat dissipation plate (not illustrated) on which the semiconductor unit is disposed and which is disposed on the rear surface of the case 30. The semiconductor unit will be described below in detail.

The case 30 has an approximately rectangular shape in plan view and has a pair of frame-portion short sides 31a and 31b and a pair of frame-portion long sides 31c and 31d. The case 30 has a storage portion 32 surrounded by the pair of frame-portion short sides 31a and 31b and the pair of frame-portion long sides 31c and 31d in its four directions. The storage portion 32 has an approximately rectangular shape in plan view. The semiconductor unit is stored in the storage portion 32 and is sealed by the sealing material 40.

The sealing material 40 seals the semiconductor unit disposed in the storage portion 32. The sealing material 40 may be thermosetting resin, such as epoxy resin, phenolic resin, maleimide polyester resin.

Preferably, the thermosetting resin is epoxy resin. Filler may be added to the sealing material 40. The filler is highly thermally conductive ceramic material having an insulating property. Examples of the filler include silicon oxide, aluminum oxide, boron nitride, and aluminum nitride. The amount of filler contained is between 10% by volume and 70% by volume, inclusive, of the entire sealing material 40.

In addition, input terminals are disposed on the frame-portion short side 31a of the case 30. Specifically, the input terminals are a P terminal 33 and an N terminal 34 disposed along the frame-portion short side 31a. In addition, an output terminal is disposed on the frame-portion short side 31b, which is opposite to the side where the input terminals on the front surface of the case 30 are disposed. Specifically, the output terminal is an M terminal 35 disposed on the frame-portion short side 31b.

The P terminal 33 and the N terminal 34 are disposed across from the M terminal 35 via the storage portion 32. In addition, the case 30 includes control terminals 36a and control terminals 36b on both sides of the M terminal 35 of the storage portion 32. These terminals each have one end portion that is electrically connected to a semiconductor chip of the semiconductor unit stored in the storage portion 32. For example, the control terminals 36a and 36b each have one end portion that is electrically connected to a control electrode, which is a gate electrode, of a semiconductor chip. In addition, the P terminal 33, the N terminal 34, and the M terminal 35 each have one end portion that is electrically connected to a main electrode such as an emitter electrode (or a source electrode) or collector electrode (or a drain electrode), of a semiconductor chip.

The heat dissipation plate is formed in a flat plate shape and has a rectangular shape in plan view. The heat dissipation plate may cover the rear surface of the storage portion 32 of the case 30 in plan view. This heat dissipation plate is made of metal material having excellent thermal conductivity. Examples of the metal material include aluminum, iron, silver, copper, and an alloy containing at least one of these kinds. Examples of the alloy include a metal composite of aluminum-silicon nitride (Al—SiC) or magnesium-silicon nitride (Mg—SiC). To improve the corrosion resistance, for example, plating may be performed to form material, such as nickel, on the surface of the heat dissipation plate.

In addition, a cooling unit (not illustrated) may be attached to the rear surface of the case 30 to which the heat dissipation plate has been attached. The cooling unit in this case is made of metal material having excellent thermal conductivity, for example. Examples of the metal material include aluminum, iron, silver, copper, and an alloy containing at least one of these kinds. The cooling unit is a heatsink having at least one fin, a water cooling jacket, or the like. The heat dissipation plate may be formed integrally with the cooling unit as described above.

The semiconductor device 10 includes an inverter circuit, and an equivalent circuit thereof is illustrated in FIG. 2. FIG. 2 illustrates a case in which reverse conducting (RC)-IGBTs are used as the semiconductor chips included in the semiconductor unit. The reference characters used for the RC-IGBTs in FIG. 2 correspond to semiconductor chips 25a and 25b included in the semiconductor unit 20 illustrated in FIG. 8. The individual arm includes two semiconductor chips 25a or 25b connected in parallel. The semiconductor unit 20 forming a corresponding phase includes two semiconductor chips 25a and two semiconductor chips 25b.

In the case of this semiconductor device 10, the P terminal 33 is electrically connected to the collector electrodes of the semiconductor chips 25b of the upper arm of the semiconductor unit in the storage portion 32. The M terminal 35 is electrically connected to the emitter electrodes of the semiconductor chips 25b of the upper arm and to the collector electrodes of the semiconductor chips 25a of the lower arm of the semiconductor unit 20 in the storage portion 32. In addition, the N terminal 34 is electrically connected to the emitter electrodes of the semiconductor chips 25a of the lower arm of the semiconductor unit in the storage portion 32. In this way, the semiconductor device 10 functions as an inverter.

Figure 3:
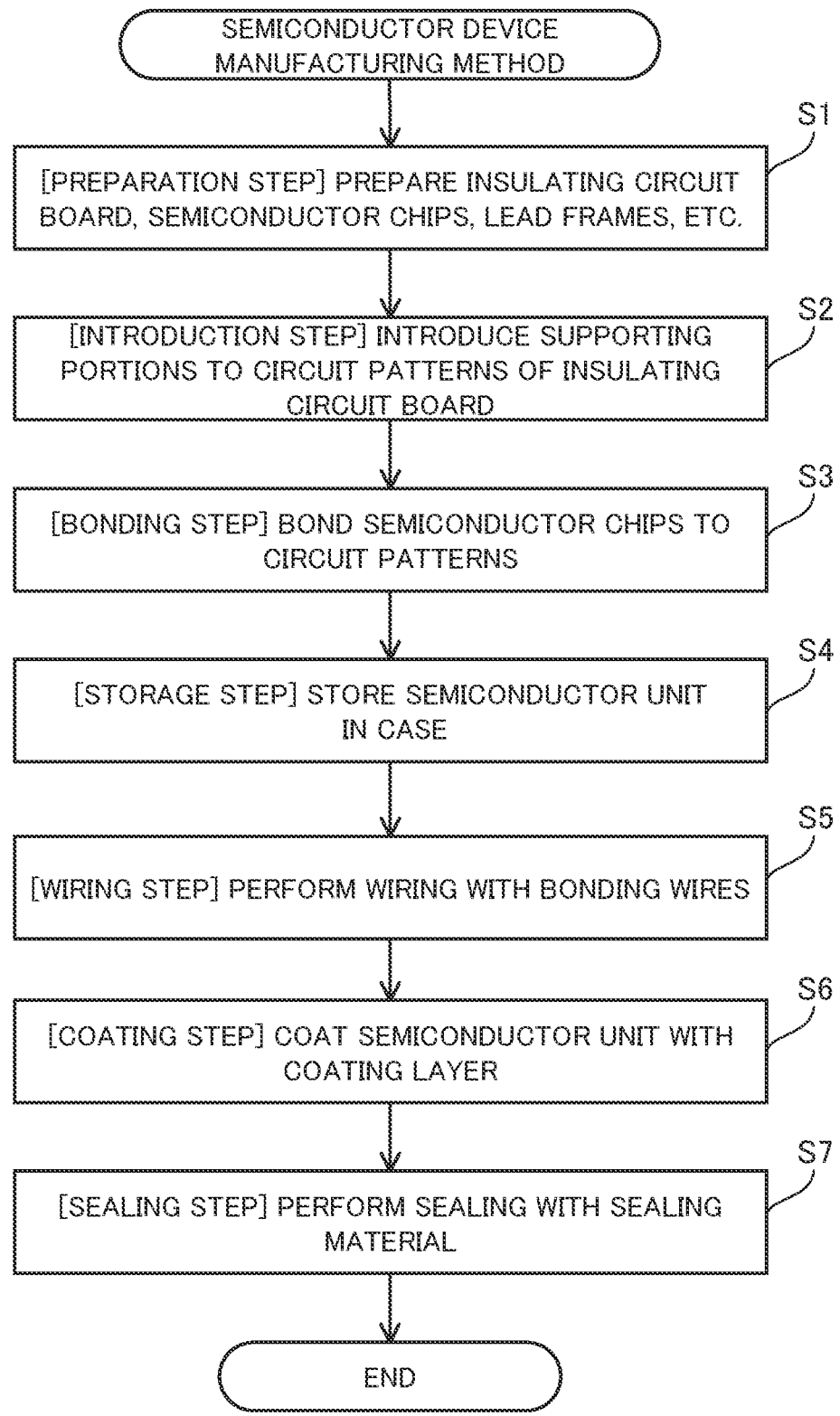
FIG. 3 is a flowchart illustrating a semiconductor device manufacturing method according to the first embodiment.
Figure 4:
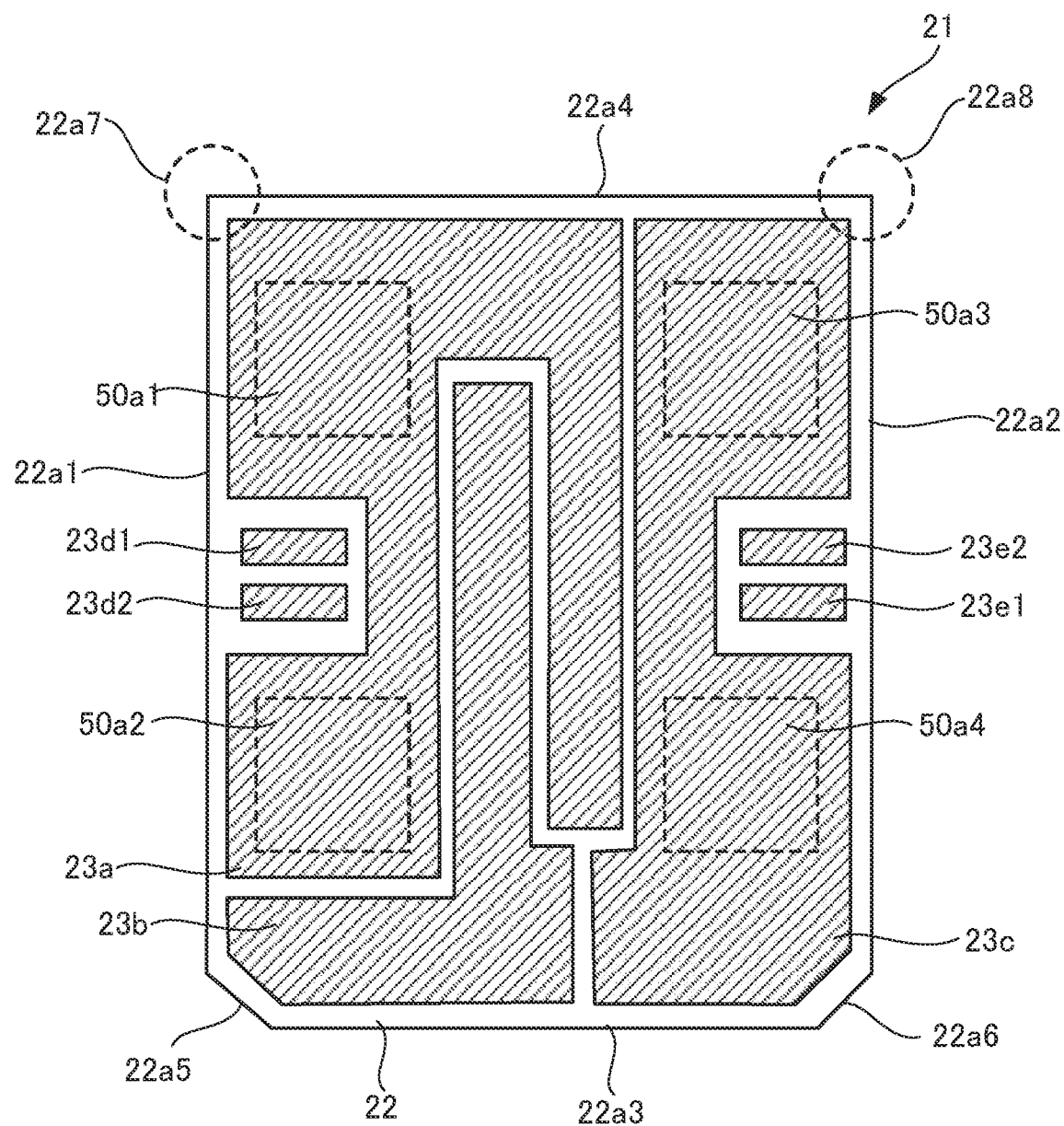
FIG. 4 is a plan view of an insulating circuit board included in the semiconductor device according to the first embodiment.
Figure 5A:
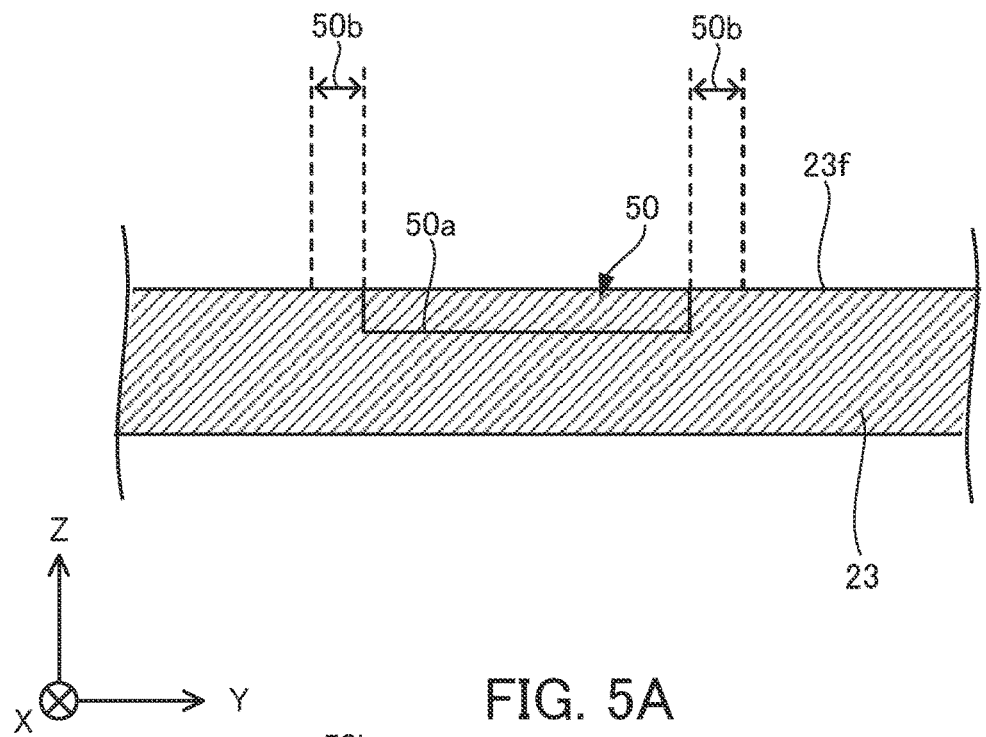
FIGS. 5A and 5B each illustrate an introduction step included in the semiconductor device manufacturing method according to the first embodiment.
Figure 5B:
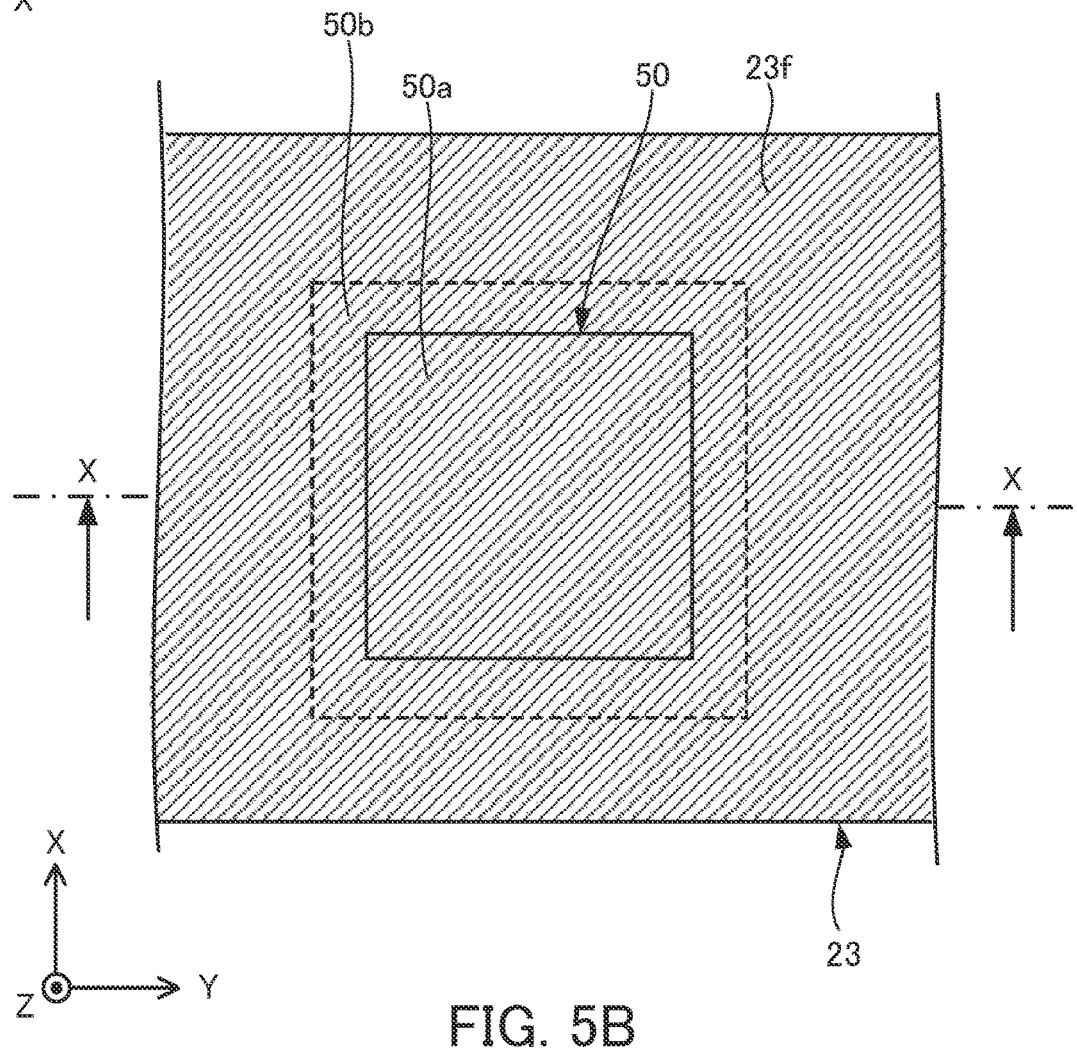
Figure 6A:
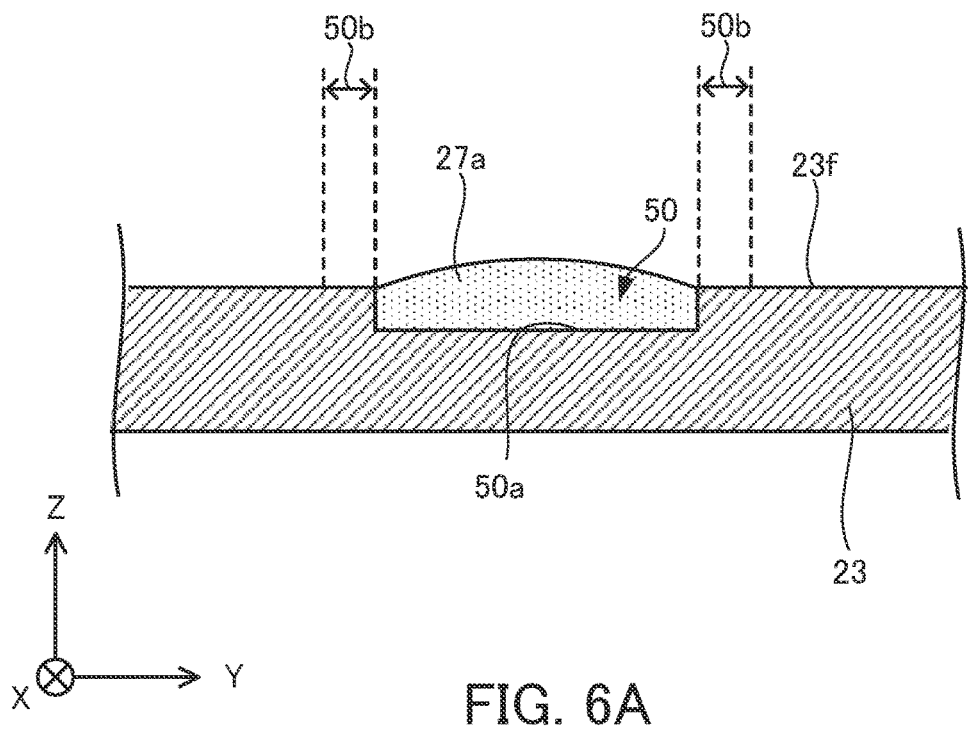
FIGS. 6A and 6B each illustrate a bonding step included in the semiconductor device manufacturing method according to the first embodiment (part 1)
Figure 6B:
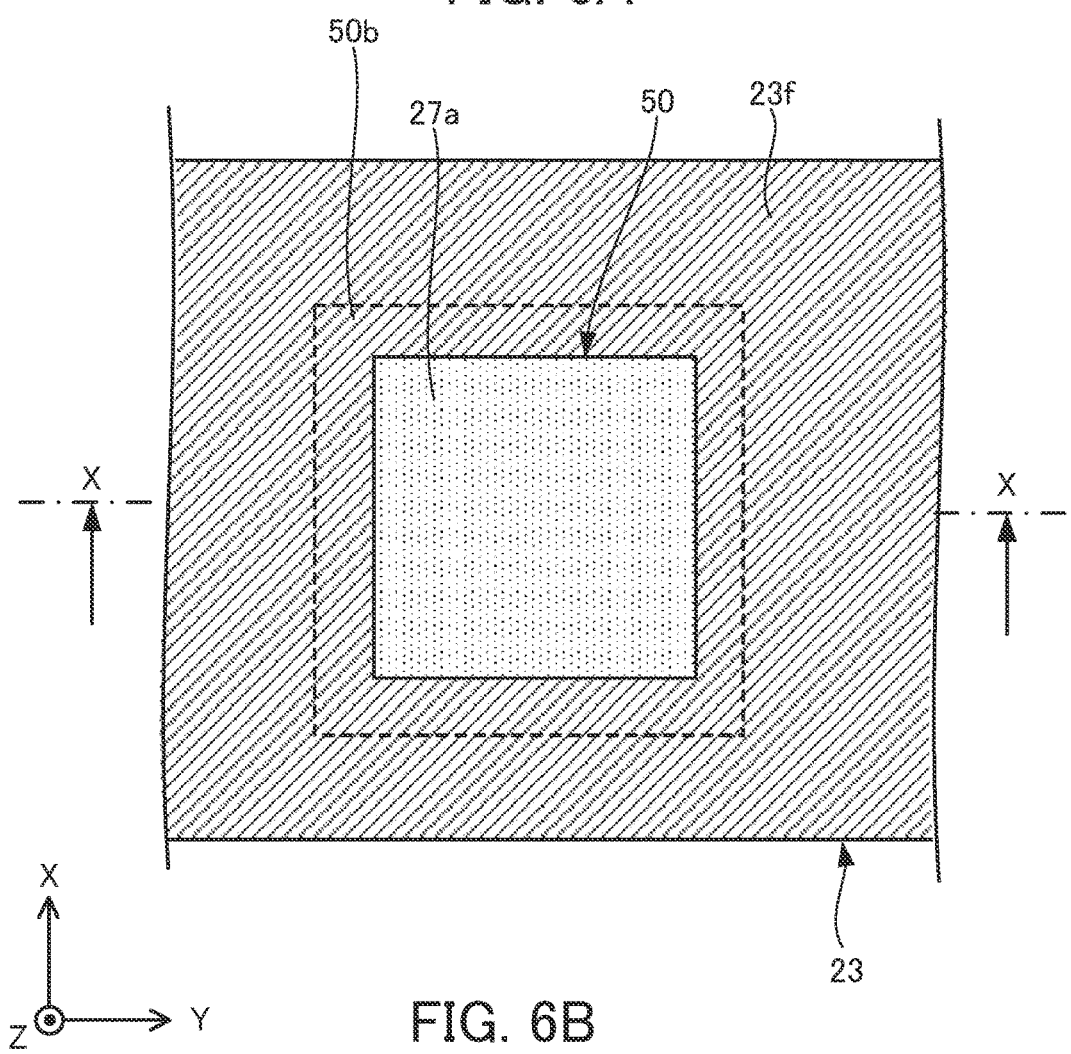
Figure 7A:
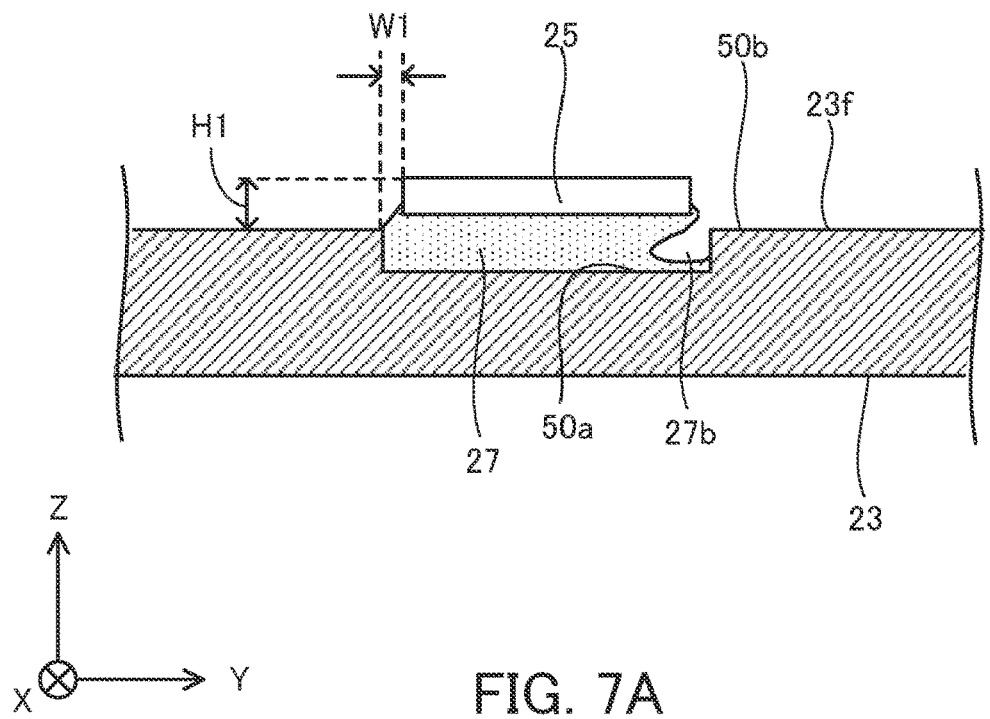
FIGS. 7A and 7B each illustrate the bonding step included in the semiconductor device manufacturing method according to the first embodiment (part 2)
Figure 7B:
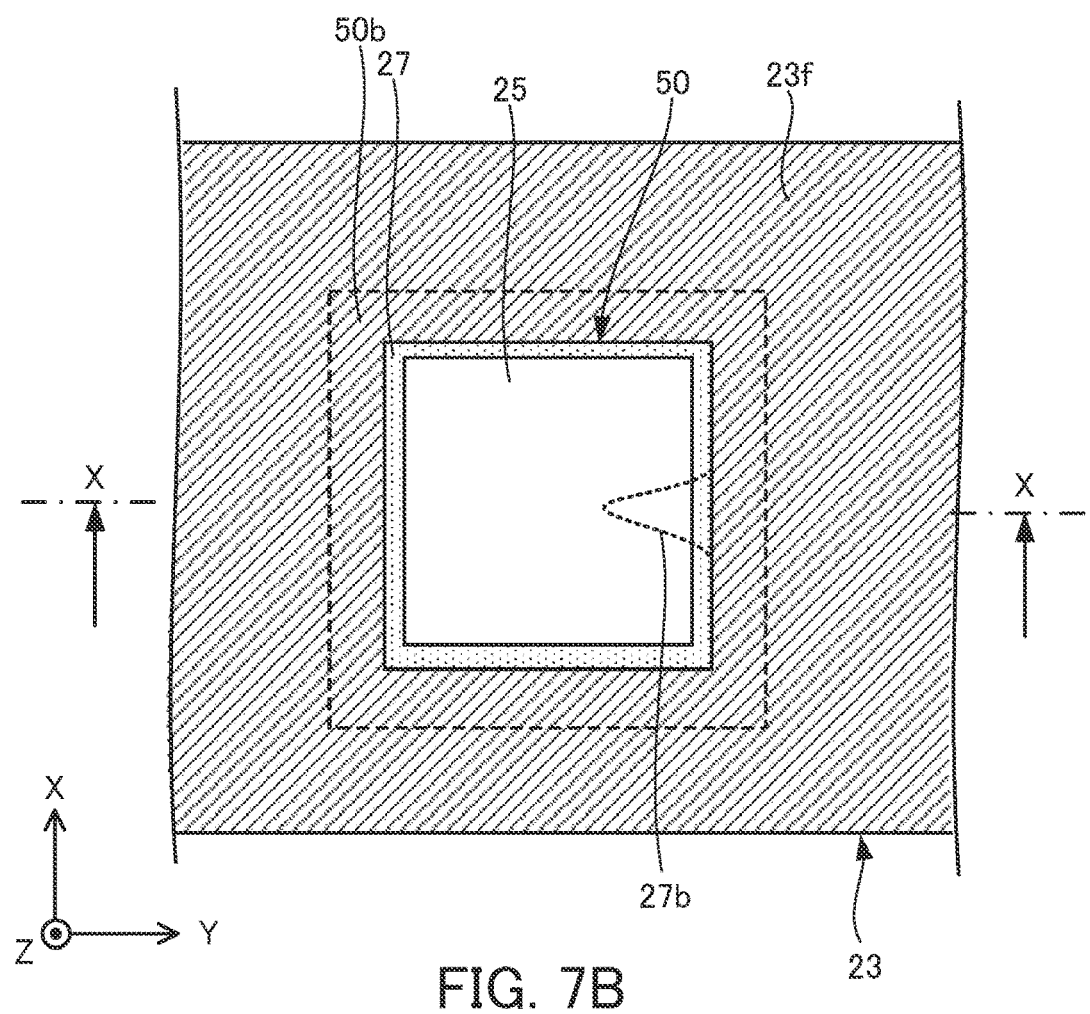
Figure 8:
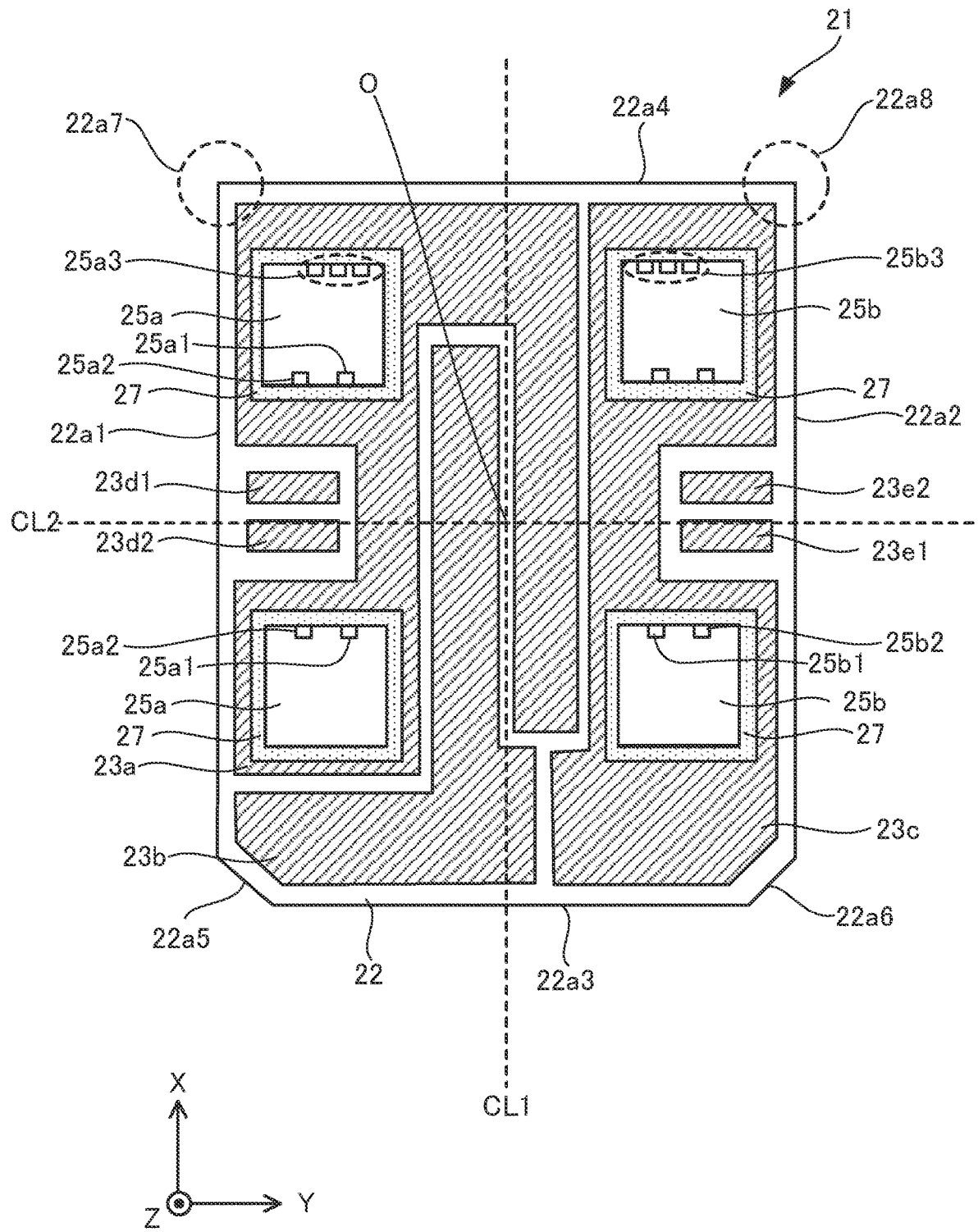
FIG. 8 is a plan view of a semiconductor unit included in the semiconductor device according to the first embodiment.
Figure 9:
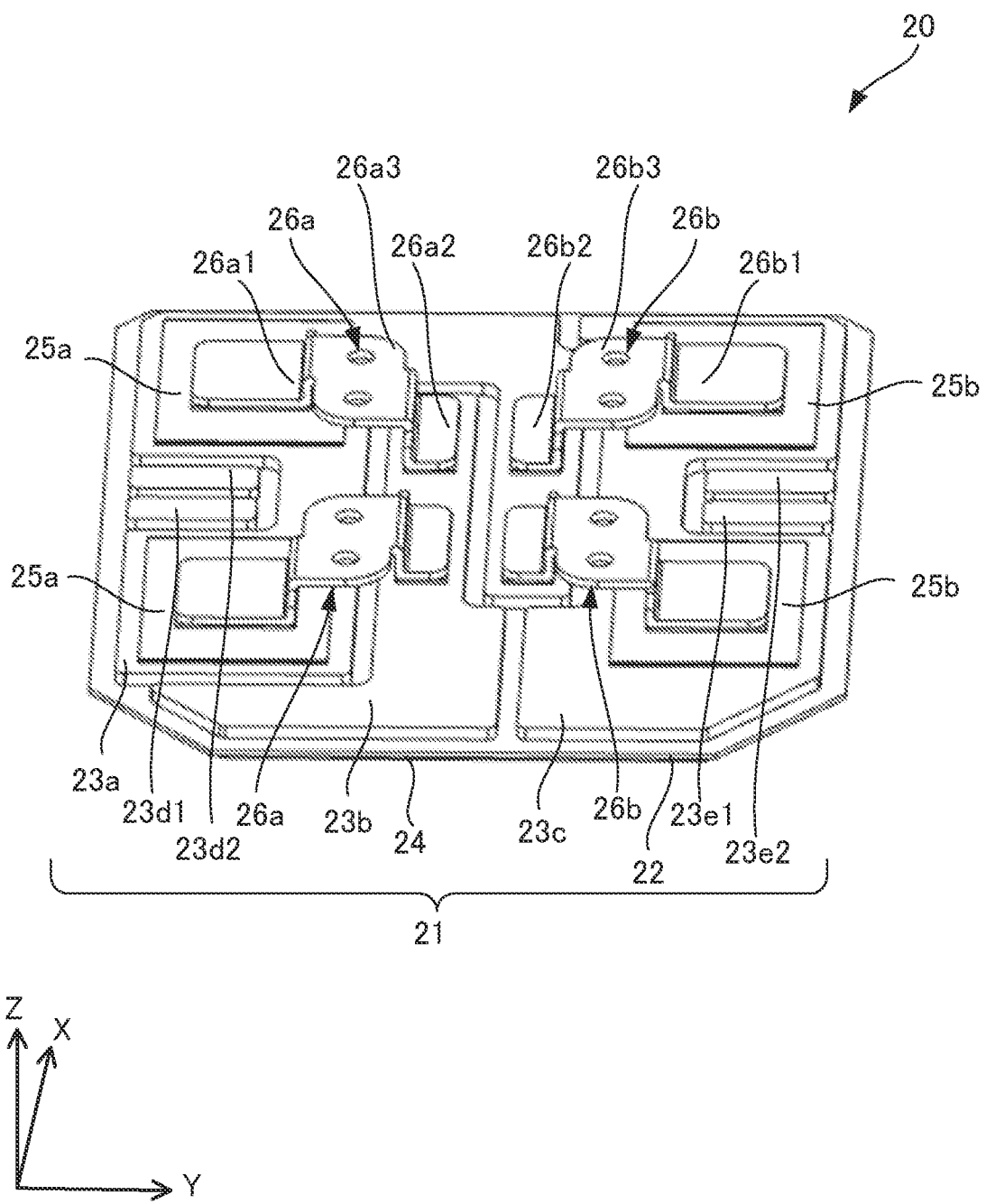
FIG. 9 is a perspective view of the semiconductor unit included in the semiconductor device according to the first embodiment.
Figure 10:
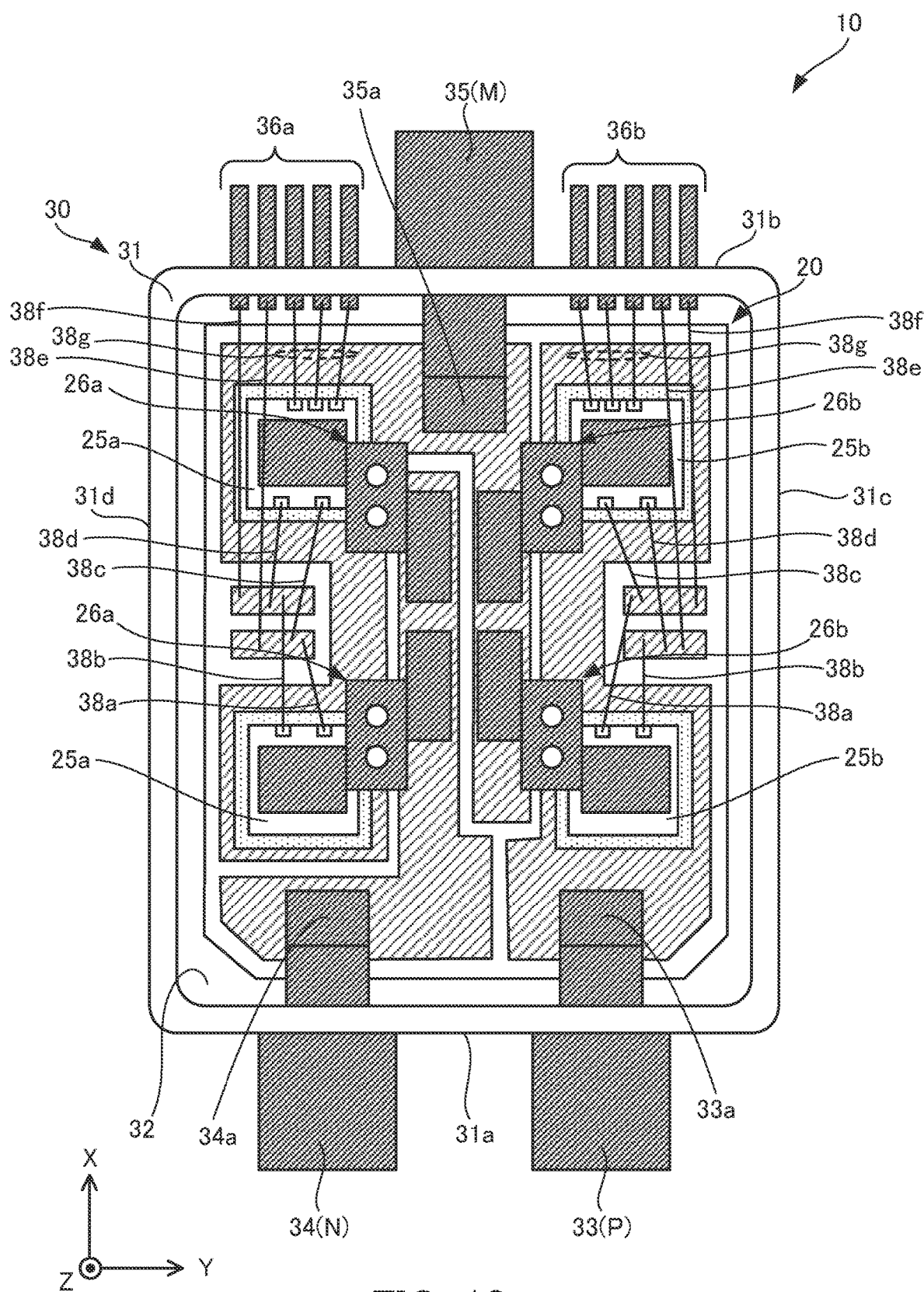
FIG. 10 illustrates a wiring step included in the semiconductor device manufacturing method according to the first embodiment.
Figure 11:
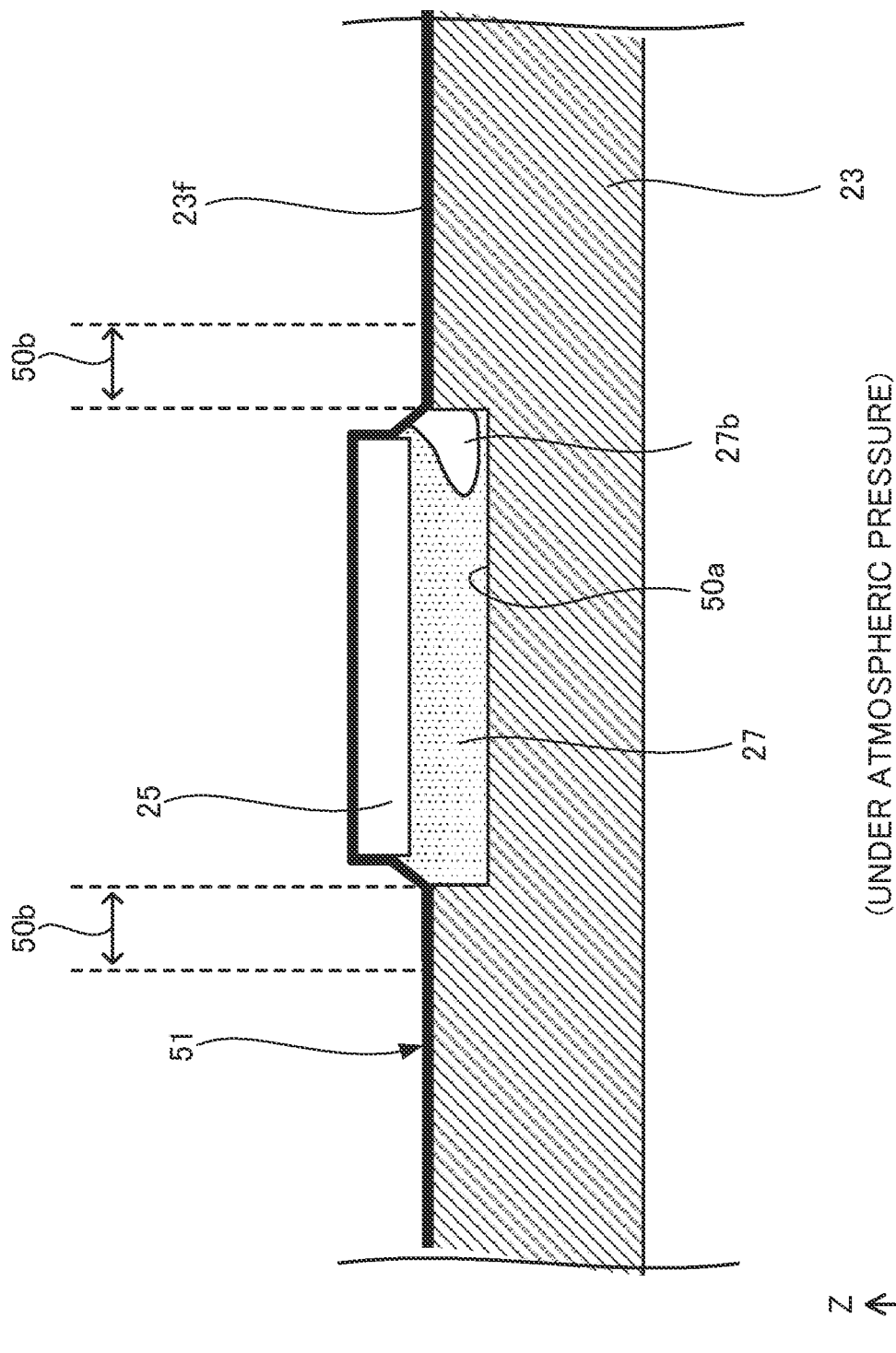
FIG. 11 illustrates a coating step included in the semiconductor device manufacturing method according to the first embodiment.
Figure 12:
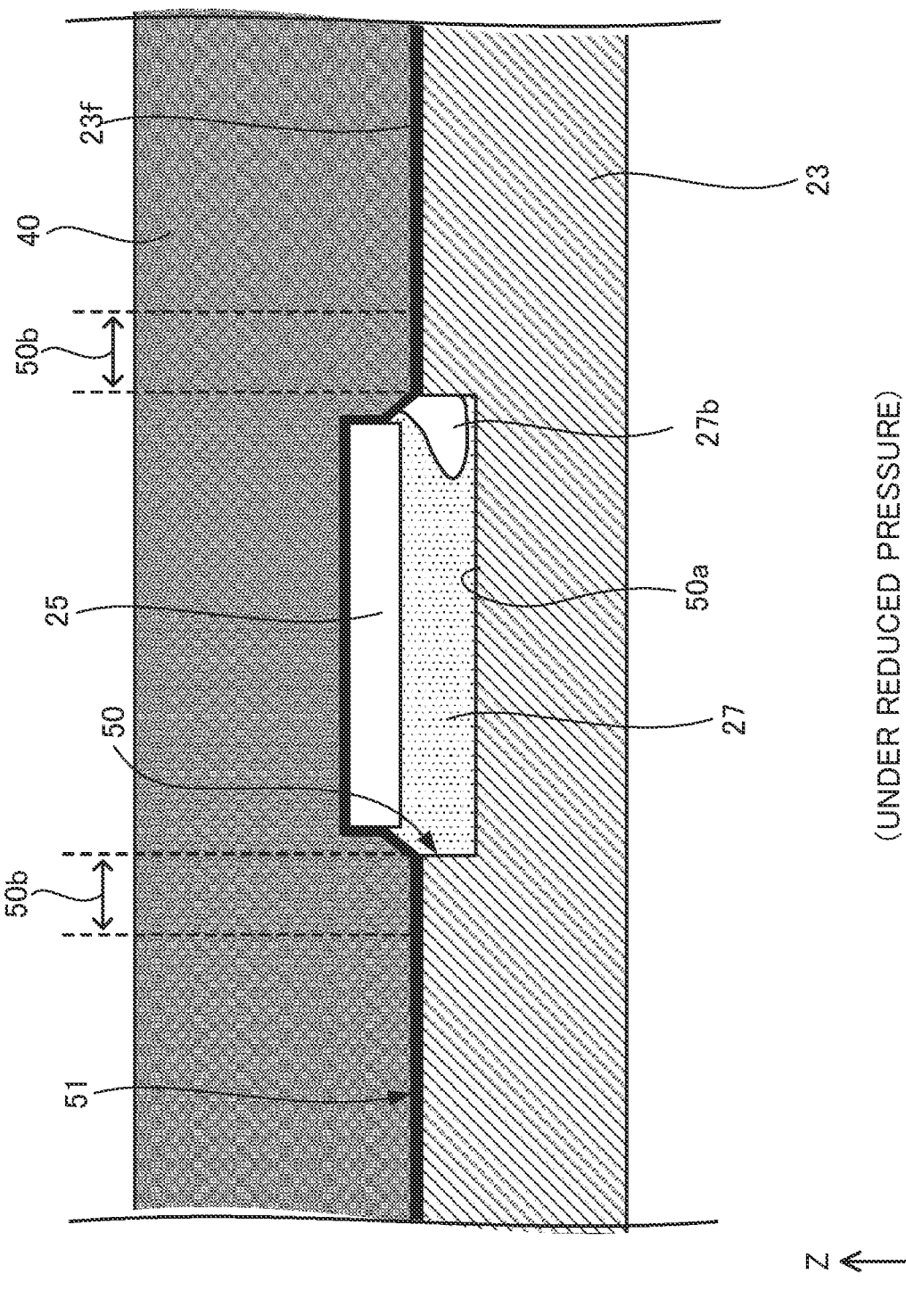
FIG. 12 illustrates a sealing step included in the semiconductor device manufacturing method according to the first embodiment.

Next, a manufacturing method of the semiconductor device 10 will be described with reference to FIG. 3 and FIGS. 4 to 12. FIG. 3 is a flowchart illustrating a semiconductor device manufacturing method according to the first embodiment. FIG. 4 is a plan view of an insulating circuit board included in the semiconductor device according to the first embodiment. FIGS. 5A and 5B each illustrate an introduction step included in the semiconductor device manufacturing method according to the first embodiment. FIGS. 6A and 6B and FIGS. 7A and 7B each illustrate a bonding step included in the semiconductor device manufacturing method according to the first embodiment. FIG. 8 is a plan view of the semiconductor unit included in the semiconductor device according to the first embodiment. FIG. 9 is a perspective view of the semiconductor unit included in the semiconductor device according to the first embodiment. FIG. 10 illustrates a wiring step included in the semiconductor device manufacturing method according to the first embodiment. FIG. 11 illustrates a coating step included in the semiconductor device manufacturing method according to the first embodiment. FIG. 12 illustrates a sealing step included in the semiconductor device manufacturing method according to the first embodiment.

FIGS. 5A to 7B each illustrate a disposition area 50a on a circuit pattern 23a or 23c (a circuit pattern 23) of an insulating circuit board 21 and each illustrate an area around the disposition area 50a. In this disposition area 50a, a semiconductor chip 25a or 25b (a semiconductor chip 25) is disposed. In FIGS. 5A to 7B, when circuit patterns 23a and 23c, which will be described below, do not need to be distinguished from each other, any one of the circuit patterns 23a and 23c will be referred to as a circuit pattern 23. In addition, when the following disposition areas 50a1, 50a2, 50a3, and 50a4 do not need to be distinguished from each other, any one of the disposition areas 50a1, 50a2, 50a3, and 50a4 will be referred to as a disposition area 50a. In addition, when the semiconductor chips 25a and 25b do not need to be distinguished from each other, any one of the semiconductor chips 25a and 25b will be referred to as a semiconductor chip 25. In addition, FIGS. 5A, 6A, and 7A are sectional views taken along a dashed-dotted line X-X in FIGS. 5B, 6B, and 7B, respectively. FIGS. 11 and 12 are also sectional views taken along the dashed-dotted line X-X. In addition, in FIGS. 8, 11, and 12, illustration of lead frames 26a and 26b is omitted.

First, a preparation step of preparing components of the semiconductor device 10 is performed (step S1 in FIG. 3). The components prepared in step S1 are, for example, the insulating circuit board 21, the semiconductor chips 25a and 25b, the lead frames 26a and 26b, the case 30, the heat dissipation plate, and the sealing material. In addition to these other needed components, components for manufacturing the semiconductor device 10 are also prepared.

The insulating circuit board 21 has a rectangular shape in plan view. The insulating circuit board 21 has chamfered corner portions in the −X direction, as illustrated in FIG. 4. The insulating circuit board 21 includes an insulating plate 22, a conductive plate formed on the front surface of the insulating plate 22, and a metal plate (not illustrated) formed on the rear surface of the insulating plate 22. The conductive plate corresponds to, for example, a plurality of circuit patterns 23a to 23c, 23d1, 23d2, 23e1, and 23e2. The plurality of circuit patterns 23a to 23c, 23d1, 23d2, 23e1, and 23e2 and the metal plate each have an outer shape smaller than the outer shape of the insulating plate 22 and are each formed on the inner side of the insulating plate 22 in plan view. The shapes of the plurality of circuit patterns 23a to 23c, 23d1, 23d2, 23e1, and 23e2 are examples, and the number of these circuit patterns is also an example.

The insulating plate 22 has a rectangular shape in plan view. Corner portions of the insulating plate 22 may be chamfered or rounded, for example. In FIG. 4, the insulating plate 22 has chamfered corner portions on its short side in the −X direction. Thus, the insulating plate 22 has a long side 22a1, a short side 22a2, a long side 22a3, and a short side 22a4 as its outer peripheral sides. The insulating plate 22 also has a diagonal side 22a5 connecting the long side 22a1 and the short side 22a3 and a diagonal side 22a6 connecting the long side 22a2 and the short side 22a3. The insulating plate 22 also has a corner portion 22a7 formed by the long side 22a1 and the short side 22a4 and a corner portion 22a8 formed by the long side 22a2 and the short side 22a4. The insulating plate 22 is made of ceramic material having good thermal conductivity. The ceramic material contains, for example, aluminum oxide, aluminum nitride, or silicon nitride as its main component. In addition, the insulating plate 22 has a thickness between 0.2 mm and 2.0 mm, inclusive.

The circuit patterns 23a to 23c, 23d1, 23d2, 23e1, and 23e2 are formed on the entire surface of the insulating plate 22, except for the edge portions of the insulating plate 22. Preferably, in plan view, edge portions of the circuit patterns 23a to 23c, 23d1, 23d2, 23e1, and 23e2, the edge portions facing the outer periphery of the insulating plate 22, overlap with edge portions of the metal plate, the edge portions facing the outer periphery of the insulating plate 22. Thus, the insulating circuit board 21 maintains the stress balance between the insulating plate 22 and the metal plate on the rear surface of the insulating plate 22. This prevents the insulating plate 22 from being damaged such as being excessively warped or cracked. The areas indicated by dashed lines on the circuit patterns 23a and 23c represent the disposition areas 50a1 to 50a4 of the semiconductor chips 25a and 25b. The circuit patterns 23a to 23c, 23d1, 23d2, 23e1, and 23e2 each have a thickness between 0.1 mm and 2.0 mm, inclusive. The circuit patterns 23a to 23c, 23d1, 23d2, 23e1, and 23e2 are each made of metal material having excellent electrical conductivity. Examples of the metal material include copper, aluminum, and an alloy containing at least one of these kinds. The surface of each of the circuit patterns 23a to 23c, 23d1, 23d2, 23e1, and 23e2 may be plated to improve its corrosion resistance. The material used for this plating is, for example, nickel, a nickel-phosphorus alloy, or a nickel-boron alloy.

The circuit pattern 23a has a U shape in plan view. That is, the circuit pattern 23a is formed to extend along the long side 22a1 and the short side 22a4 of the insulating plate 22 and to extend in the −X direction. The circuit pattern 23a is formed in an area including the corner portion 22a7 of the insulating plate 22. The circuit pattern 23a has a thin portion along the long side 22a1 of the insulating plate 22. The circuit patterns 23d1 and 23d2 are formed beside this thin portion. The circuit patterns 23d1 and 23d2 each have a rectangular shape extending in the ±Y directions. The disposition areas 50a1 and 50a2 are formed on two sides of the pair of circuit patterns 23d1 and 23d2. That is, the disposition area 50a1 is located near the long side 22a1 and the short side 22a4 of the insulating circuit board 21. That is, the disposition area 50a1 is located near the corner portion 22a7. The disposition area 50a2 is located near the short side 22a3 (the diagonal side 22a5) and the long side 22a1 of the insulating circuit board 21.

The circuit pattern 23b has an L shape in plan view. The circuit pattern 23b is formed to extend from the diagonal side 22a5 along the short side 22a3 of the insulating plate 22 in the +Y direction and to extend into a space formed by the circuit pattern 23a. The circuit pattern 23b has a chamfered end portion (in the −Y direction) that faces the diagonal side 22a5 of the insulating plate 22.

The circuit pattern 23c has an I shape in plan view. That is, the circuit pattern 23c is formed to extend from the short side 22a3 to the short side 22a4 along the long side 22a2 of the insulating plate 22. The circuit pattern 23c is formed in an area including the corner portion 22a8 of the insulating plate 22. The circuit pattern 23c has a thin portion along the long side 22a2 of the insulating plate 22. The circuit patterns 23e1 and 23e2 are formed beside the thin portion. The circuit patterns 23e1 and 23e2 each have a rectangular shape extending in the +Y directions. The disposition areas 50a3 and 50a4 are formed on two sides of the pair of circuit patterns 23e1 and 23e2. That is, the disposition area 50a3 is located near the long side 22a2 and the short side 22a4 of the insulating circuit board 21. That is, the disposition area 50a3 is located near the corner portion 22a8. The disposition area 50a4 is located near the short side 22a3 (the diagonal side 22a6) and the long side 22a2 of the insulating circuit board 21.

The circuit patterns 23a to 23c, 23d1, 23d2, 23e1, and 23e2 formed on the insulating plate 22 are obtained by forming a metal plate on the front surface of the insulating plate 22 and performing, for example, etching on this metal plate. Alternatively, the circuit patterns 23a to 23c, 23d1, 23d2, 23e1, and 23e2 that have previously been cut out of a metal plate may be attached to the front surface of the insulating plate 22 by applying pressure. The circuit patterns 23a to 23c, 23d1, 23d2, 23e1, and 23e2 are examples. The number of circuit patterns may be selected as needed. In addition, the shapes, sizes, etc. of the circuit patterns may also be selected as needed.

The metal plate has a rectangular shape in plan view. In addition, corner portions of the metal plate may be chamfered or rounded, for example. In FIG. 4, corners of the metal plate are chamfered to match the shape of the insulating plate 22. In addition, the metal plate is smaller than the insulating plate 22 and is formed on the entire rear surface of the insulating plate 22, except for the edge portions of the insulating plate 22. The metal plate is made of metal material having excellent thermal conductivity as its main component. The metal material is, for example, copper, aluminum, or an alloy containing at least one of these kinds. The metal plate has a thickness between 0.1 mm and 2.0 mm, inclusive. The metal plate may be plated to improve its corrosion resistance. The material used for this plating is, for example, nickel, a nickel-phosphorus alloy, or a nickel-boron alloy.

For example, a direct copper bonding (DCB) substrate or an active metal brazed (AMB) substrate may be used as the insulating circuit board 21 having the above structure. The heat generated by the semiconductor chips 25a and 25b to be described below is transferred to the rear surface of the insulating circuit board 21 via the circuit patterns 23a and 23c, the insulating plate 22, and the metal plate of the insulating circuit board 21. The heat is consequently released to the outside.

The semiconductor chips 25a and 25b (see FIGS. 8 and 9) are each a power device made of silicon, silicon carbide, or gallium nitride. As described above, the semiconductor chips 25a and 25b are RC-IGBTs. An RC-IGBT is formed by forming an IGBT as a switching element and a free wheeling diode (FWD) as a diode element on a single chip. Each of the semiconductor chips 25a and 25b has, for example, a collector electrode and an anode electrode as its main electrodes on its rear surface and has a gate electrode as a control electrode 25a1 or 25b1 and an emitter electrode and a cathode electrode as its main electrode 25a2 or 25b2 on its front surface. The semiconductor chips 25a may further include a plurality of sense electrodes 25a3 on its front surface, and the semiconductor chips 25b may further include a plurality of sense electrodes 25b3 on its front surface. In FIG. 8, the semiconductor chip 25a and the semiconductor chip 25b that are disposed near the short side 22a4 include a plurality of sense electrodes 25a3 and a plurality of sense electrodes 25b3, respectively.

In addition, the switching element and the diode element on the individual semiconductor chip 25a (or the individual semiconductor chip 25b) may be formed on separate chips. In this case, the switching element is, for example, a power MOSFET or an IGBT. In this case, the individual semiconductor chip 25a (or the individual semiconductor chip 25b) has, for example, a drain electrode (or a collector electrode) as its main electrode on its rear surface and has a gate electrode as its control electrode and a source electrode (or an emitter electrode) as its main electrode on its front surface.

In addition, the diode element is, for example, an FWD such as a Schottky barrier diode (SBD) or a P-intrinsic-N (PIN) diode. In this case, the individual semiconductor chip 25a (or the individual semiconductor chip 25b) has a cathode electrode as its main electrode on its rear surface and has an anode electrode as its main electrode on its front surface. The semiconductor chips 25a and 25b each have a thickness between 80 μm and 500 μm, inclusive. For example, the semiconductor chips 25a and 25b each have a thickness of 200 μm.

The lead frames 26a and 26b (see FIG. 9) are each made of material having excellent electrical conductivity. The material is, for example, copper, aluminum, or an alloy containing at least one of these kinds. Preferably, the lead frames 26a and 26b each have a thickness between 0.2 mm and 4.0 mm, inclusive, more preferably, between 0.5 mm and 1.5 mm, inclusive. The surface of each of the lead frames 26a and 26b may be plated to improve its corrosion resistance. The material used for this plating, for example, nickel, a nickel-phosphorus alloy, or a nickel-boron alloy. Each of the lead frames 26a is formed by integrally bonding a bonding portion 26a1, a wiring portion 26a3, and a bonding portion 26a2. Each of the lead frames 26b is formed by integrally bonding a bonding portion 26b1, a wiring portion 26b3, and a bonding portion 26b2.

The case 30 includes a frame portion 31 that has a rectangular shape in plan view and that surrounds the opening formed from the front surface to the rear surface of the case 30. The case 30 also includes the P terminal 33, the N terminal 34, the M terminal 35, and the control terminals 36a and 36b attached to the frame portion 31 (see FIG. 10). The outer shape of the frame portion 31 is a flat plate shape, and the frame portion 31 includes the pair of frame-portion short sides 31a and 31b that face each other and the pair of frame-portion long sides 31c and 31d that face each other and that are orthogonal to the frame-portion short sides 31a and 31b. The opening is formed between the inner wall surfaces of the frame-portion short sides 31a and 31b and between the inner wall surfaces of the frame-portion long sides 31c and 31d of the frame portion 31 and along the frame-portion short sides 31a and 31b and the frame-portion long sides 31c and 31d. That is, the opening has a rectangular shape orthogonal and parallel to the frame portion 31 in plan view. That is, the opening in the frame portion 31 serves as the storage portion 32. The shape of the storage portion 32 in plan view corresponds to the shape of the insulating circuit board 21. The storage portion 32 according to the present embodiment have chamfered corner portions in plan view. Alternatively, the storage portion 32 may have a substantially rectangular shape.

The frame portion 31 as described above is formed by injection molding in which the P terminal 33, the N terminal 34, the M terminal 35, and the control terminals 36a and 36b are set in a predetermined mold and thermoplastic resin containing filler is injected into the mold. Examples of the thermoplastic resin include polyphenylene sulfide resin, polybutylene terephthalate resin, polybutylene succinate resin, polyamide resin, and acrylonitrile butadiene styrene resin. The filler is, for example, silicon oxide, aluminum oxide, boron nitride, or aluminum nitride. In particular, the frame-portion 31 is made of polyphenylene sulfide resin containing any one of the filler.

The P terminal 33 is formed integrally with the inner wall of the frame-portion short side 31a of the storage portion 32 along the frame-portion short side 31a of the frame portion 31. The other end portion of the P terminal 33 extends from the frame-portion short side 31a to the outside perpendicularly to the frame-portion short side 31a (in the −X direction). In addition, the P terminal 33 includes a P connection portion 33a at one end portion thereof. The P connection portion 33a is formed in a flat plate shape and perpendicularly protrudes from the inner wall of the frame-portion short side 31a of the storage portion 32 to the inside of the storage portion 32.

The N terminal 34 is formed integrally with the inner wall of the frame-portion short side 31a of the storage portion 32 along the frame-portion short side 31a of the frame-portion 31. The N terminal 34 is adjacent to the P terminal 33. The other end portion of the N terminal 34 extends from the frame-portion short side 31a to the outside perpendicularly to the frame-portion short side 31a (in the −X direction). In addition, the N terminal 34 includes an N connection portion 34a at one end portion thereof. The N connection portion 34a is formed in a flat plate shape and perpendicularly protrudes from the inner wall of the frame-portion short side 31a to the inside of the storage portion 32. The N connection portion 34a is also adjacent to the P connection portion 33a.

The M terminal 35 is formed integrally with the inner wall of the frame-portion short side 31b of the storage portion 32 along the frame-portion short side 31b on the front surface of the frame portion 31. The other end portion of the M terminal 35 extends from the frame-portion short side 31b to the outside perpendicularly to the frame-portion short side 31b (in the +X direction). In addition, the M terminal 35 includes an M connection portion 35a at one end portion thereof. The M connection portion 35a is formed in a flat plate shape and protrudes from approximately the center portion of the inner wall of the frame-portion short side 31b to the inside of the storage portion 32 perpendicularly to the inner wall. The M connection portion 35a is located opposite the P connection portion 33a and the N connection portion 34a via the storage portion 32.

The plurality of control terminals 36a and the plurality of control terminals 36b each have a rod shape. The control terminals 36a and 36b each have the other end portion that extends from the frame-portion short side 31b to the outside perpendicularly to the frame-portion short side 31b (in the +X direction). In addition, the control terminals 36a and 36b are each formed along the inner wall of the frame-portion short side 31b of the storage portion 32 on the front surface of the frame-portion 31 and each have one end portion thereof that protrudes from the inner wall to the inside of the storage portion 32 perpendicularly to the inner wall. In addition, the control terminals 36a and 36b are located opposite to the P connection portion 33a and the N connection portion 34a via the storage portion 32.

The P terminal 33, the N terminal 34, the M terminal 35, and the control terminals 36a and 36b are made of material having excellent electrical conductivity. The material is, for example, copper, aluminum, or an alloy containing at least one of these kinds. Preferably, the P terminal 33, the N terminal 34, the M terminal 35, and the control terminals 36a and 36b each have a thickness between 0.2 mm and 4.0 mm, inclusive, more preferably, between 0.5 mm and 1.5 mm, inclusive. The surface of each of the P terminal 33, the N terminal 34, the M terminal 35, and the control terminals 36a and 36b may be plated to improve its corrosion resistance. In this case, the material for the plating, for example, nickel, a nickel-phosphorus alloy, or a nickel-boron alloy.

Next, an introduction step of introducing supporting portions to the circuit patterns 23a and 23c of the insulating circuit board 21 is performed (step S2 in FIG. 3). As illustrated in FIGS. 5A and 5B, a concave portion 50 is formed in the individual disposition area 50a of a circuit front surface 23f of the individual circuit pattern 23. The disposition area 50a corresponds to the bottom surface of the concave portion 50. The concave portion 50 is formed, for example, by performing cutting processing on the circuit pattern 23. The cross section of the concave portion 50 is schematically illustrated as a rectangle in FIG. 5A. The concave portion 50 may have rounded corner portions near the disposition area 50a. The opening edges of the concave portion 50 may also be rounded. In addition, the disposition area 50a is schematically illustrated as a flat area in FIG. 5A. Alternatively, the disposition area 50a may have bumps and dips or may have an inclined surface. The depth of the concave portion 50 may be between 10% and 90%, inclusive, of the thickness of the circuit pattern 23, depending on the thickness of the semiconductor chip 25 and the thickness of the bonding material 27.

Upon completion of forming the concave portion 50 in the disposition area 50a of the circuit pattern 23, a surrounding area 50b (a supporting portion) that continuously surrounds the disposition area 50a in the form of a ring is located at a higher level than the disposition area 50a in the +Z direction. In this case, the surrounding area 50b and the circuit front surface 23f other than the disposition area 50a are on the same plane. Alternatively, the surrounding area 50b may be located at a higher level than the circuit front surface 23f other than the disposition area 50a. For example, to form the concave portion 50, metal processing is performed on the disposition area 50a of the circuit front surface 23f of the circuit pattern 23. As a result of the formation of the concave portion 50, the surrounding area 50b may protrude (may be raised) from the circuit front surface 23f. This case will be described in detail below as variation 1.

Next, a bonding step of bonding the semiconductor chip 25 to the disposition area 50a of the circuit pattern 23 is performed (step S3 in FIG. 3). As illustrated in FIGS. 6A and 6B, paste bonding material 27a is applied to the disposition area 50a of the circuit pattern 23 formed in step S2. The disposition area 50a is located on the bottom surface of the concave portion 50. When the paste bonding material 27a is applied to the disposition area 50a, the concave portion 50 has a function of positioning the paste bonding material 27a and a function of preventing the paste bonding material 27a from spreading. The bonding material 27a is solder. As this solder, lead-free solder is used. The main component of the lead-free solder is, for example, an alloy containing at least two of tin, silver, copper, zinc, antimony, indium, and bismuth. The solder may contain additive, which is, for example, nickel, germanium, cobalt, or silicon. Since solder containing such additive has improved wettability, luster, and bonding strength, the reliability is improved. Alternatively, the paste bonding material 27a is formed by adding flux including rosin or the like to the solder as described above. Instead of the paste bonding material 27a, a plate-like bonding material 27a may be disposed in the concave portion 50.

The semiconductor chip 25 is disposed in the disposition area 50a, which is the bottom surface of the concave portion 50, via the bonding material 27a. The bonding material 27a in the concave portion 50 in which the semiconductor chip 25 has been disposed is heated and melted. The melted bonding material 27a is surrounded by the surrounding area 50b (the supporting portion) located at a higher level than the disposition area 50a (the concave portion 50). Thus, the bonding material 27a does not spread from the disposition area 50a. Therefore, by disposing the semiconductor chip 25 on the bonding material 27a, the semiconductor chip 25 is disposed on the disposition area 50a without fail. As described above, the concave portion 50 has a function of positioning the semiconductor chip 25 with respect to the disposition area 50a. Next, cooling is performed to solidify the bonding material 27a. As a result, as illustrated in FIGS. 7A and 7B, the semiconductor chip 25 is bonded to the disposition area 50a (the concave portion 50) via the bonding material 27. In addition, as illustrated in FIG. 8, the semiconductor chips 25a are bonded to the circuit pattern 23a of the insulating circuit board 21, and the semiconductor chips 25b are bonded to the circuit pattern 23c of the insulating circuit board 21.

The front surface of the bonded semiconductor chip 25 (this front surface will hereinafter be referred to as "chip front surface") is located at a higher level than the front surface (highest point) of the surrounding area 50b (the supporting portion). In this case, the surrounding area 50b and the circuit front surface 23f are on the same plane. Thus, the front surface of the semiconductor chip 25 is located at a higher level than the circuit front surface 23f. The length from the surrounding area 50b to the front surface of the semiconductor chip 25 is indicated as a height H1 (see FIG. 7A). In addition, the length from an outer peripheral portion of the semiconductor chip 25 to an opening edge portion of the surrounding area 50b (an outer peripheral portion of the bonding material 27) is indicated as a width W1 (see FIG. 7A). A side portion of the bonding material 27 bonding the semiconductor chip 25 and the concave portion 50 is gradually inclined between the outer peripheral portion of the semiconductor chip 25 and the opening edge portion of the concave portion 50. There are cases in which a cavity 27b is formed in a part of a side portion of the bonding material 27. The cavity 27b extends from a part of a side portion of the bonding material 27 into the inside of the bonding material 27. That is, a void referred to as the cavity 27b is formed in the bonding material 27 under the semiconductor chip 25, as illustrated in plan view in FIG. 7B.

Next, bonding of the semiconductor chips 25a and 25b to the insulating circuit board 21 via the bonding material 27 will be described. A center line CL1 in FIG. 8 runs through the center of each of the opposite short sides 22a3 and 22a4 of the insulating circuit board 21. A center line CL2 in FIG. 8 runs through the center of each of the opposite long sides 22a1 and 22a2 of the insulating circuit board 21. Thus, a center point O is the intersection of the center lines CL1 and CL2 in FIG. 8.

The insulating circuit board 21 including the disposition areas 50a1 to 50a4 (see FIG. 4) on which the semiconductor chips 25a and 25b are disposed via the paste bonding material 27a is placed in a solder bonding apparatus. The insulating circuit board 21 is heated and cooled by the solder bonding apparatus from its rear surface. That is, the insulating circuit board 21 is heated and cooled concentrically from the center point O in FIG. 8 to its outer peripheral portions. In particular, when the insulating circuit board 21 is cooled, the melted bonding material 27a in the disposition areas 50a1 to 50a4 is also cooled from the center point O to the outer peripheral portions. When the melted bonding material 27a is cooled in this way, the outer peripheral portions thereof corresponding to the outer peripheral portions of the insulating circuit board 21 are cooled last. The corresponding outer peripheral portions in the disposition area 50a1 are located near the long side 22a1 and the short side 22a4. The corresponding outer peripheral portions in the disposition area 50a2 are located near the long side 22a1 and the short side 22a3. The corresponding outer peripheral portions in the disposition area 50a3 are located near the long side 22a2 and the short side 22a4. The corresponding outer peripheral portions in the disposition area 50a4 are located near the long side 22a2 and the short side 22a3.

When the bonding material 27a is cooled, its portion located closer to the center point O solidifies first. In addition, when the melted bonding material 27a is cooled, its volume contracts. Thus, the individual melted bonding material 27a agglutinates in the direction of the center point O where the solidification occurs first. In this case, the bonding material 27a becomes sparse in the outer area. Thus, when the solidification occurs in the outer area, the bonding material 27a agglutinates due to the contraction that occurs at the time of the solidification. Unless the bonding material 27a has a sufficient volume for compensating for the agglutination, a void (a cavity 27b) is formed.

The opening of such a cavity 27b as described above is exposed from a side portion of the bonding material 27. The height of the opening of the cavity 27b (the length in the +Z directions in FIG. 7A) is up to approximately the height of the side portion of the bonding material 27. In addition, at least a part of the opening of the cavity 27b is covered by the concave portion 50, for example, as illustrated in FIG. 7A. While the width of the opening of the cavity 27b in the X-Y plane direction depends on the size of the bonding material 27, the width is, for example, more than 0 mm and less than or equal to 2.0 mm. For example, the width is approximately 0.5 mm.

In step S3, the individual lead frames 26a are also bonded to the semiconductor chips 25a and the circuit patterns 23a and 23b via bonding material (not illustrated). Likewise, the individual lead frames 26b are also bonded to the semiconductor chips 25b and the circuit patterns 23a and 23c via bonding material (not illustrated). The individual lead frame 26a includes a bonding portion 26a1, a wiring portion 26a3, and a bonding portion 26a2 that are integrally bonded to each other. The individual bonding portion 26a1 is bonded to a main electrode on the front surface of a semiconductor chip 25a via bonding material. The individual bonding portion 26a2 is bonded to the circuit pattern 23b via bonding material. The individual wiring portion 26a3 electrically connects the corresponding bonding portions 26a1 and 26a2. The individual wiring portion 26a3 is located in parallel to the front surface of the insulating circuit board 21.

In addition, the individual lead frame 26b includes a bonding portion 26b1, a wiring portion 26b3, and a bonding portion 26b2 that are integrally bonded to each other. The individual bonding portion 26b1 is bonded to a main electrode on the front surface of a semiconductor chip 25b via bonding material. The individual bonding portion 26b2 is bonded to the circuit pattern 23a via bonding material. The individual wiring portion 26b3 electrically connects the corresponding bonding portions 26b1 and 26b2. The individual wiring portion 26b3 is located in parallel to the front surface of the insulating circuit board 21.

In this way, as illustrated in FIG. 9, the semiconductor unit 20 including the insulating circuit board 21 on which the semiconductor chips 25a and 25b and the lead frames 26a and 26b have been bonded in this order is obtained.

Next, a storage step of storing the semiconductor unit 20 obtained in step S3 in the case 30 is performed (step S4 in FIG. 3). The semiconductor unit 20 is disposed on the heat dissipation plate via bonding material (not illustrated) such that the semiconductor unit 20 is stored in the storage portion 32. The case 30 is disposed on the heat dissipation plate on which the semiconductor unit 20 is disposed such that the semiconductor unit 20 is stored in the storage portion 32. The case 30 is bonded to the heat dissipation plate by adhesive.

After the semiconductor unit 20 is stored in the storage portion 32 in this way, the N connection portion 34a is electrically connected to the circuit pattern 23b via a block portion (not illustrated). The P connection portion 33a is electrically connected to the circuit pattern 23c via a block portion (not illustrated). In addition, the M connection portion 35a is electrically connected to the circuit pattern 23a via a block portion (not illustrated).

The rear surface of each of the block portions may previously be bonded to a predetermined one of the circuit patterns 23a to 23c via bonding material such as solder or sintered metal material. Each of the block portions may be bonded to a corresponding one of the P connection portion 33a, the N connection portion 34a, and the M connection portion 35a of the individual terminals via bonding material. Alternatively, each of the block portions may directly be bonded to a corresponding one of the P connection portion 33a, the N connection portion 34a, and the M connection portion 35a of the individual terminals by laser or the like. The block portions are each made of having excellent electrical conductivity. The material material is, for example, copper, aluminum, or an alloy containing at least one of these kinds. Each of the block portions (not illustrated) has a thickness that corresponds to the gap between the corresponding connection portion and the corresponding circuit pattern. In addition, for example, material, such as nickel, may be formed on the surface of the individual block portion by plating or the like to improve the corrosion resistance.

The semiconductor device 10 may be structured without the block portions. In this case, for example, the N connection portion 34a may be diagonally bonded to the N terminal 34 and may directly be connected to the circuit pattern 23b via bonding material. Similarly, the P connection portion 33a may be diagonally bonded to the P terminal 33 and may directly be connected to the circuit pattern 23c. Similarly, the M connection portion 35a may be diagonally bonded to the M terminal 35 and may directly be connected to the circuit pattern 23a. The N connection portion 34a, the P connection portion 33a, and the M connection portion 35a may be bonded to the circuit patterns 23b, 23c, and 23a, respectively, via bonding material such as solder or sintered metal material. Alternatively, the N connection portion 34a, the P connection portion 33a, and the M connection portion 35a may directly be bonded to the circuit patterns 23b, 23c, and 23a by laser or the like.

Next, a wiring step of wiring the semiconductor unit 20 stored in the case 30 and the control terminals 36a and 36b with bonding wires is performed (step S5 in FIG. 3). In the storage portion 32 of the case 30 in which the semiconductor unit 20 is stored in step S4, as illustrated in FIG. 10, the control electrode 25a1 of the semiconductor chip 25a (located near the frame-portion short side 31a) is connected to the circuit pattern 23d2 by a bonding wire 38a. The main electrode 25a2 of the semiconductor chip 25a (located near the frame-portion short side 31a) is connected to the circuit pattern 23d1 by a bonding wire 38b. The control electrode 25a1 of the semiconductor chip 25a (located near the frame-portion short side 31b) is connected to the circuit pattern 23d2 by a bonding wire 38c. The main electrode 25a2 of the semiconductor chip 25a (located near the frame-portion short side 31b) is connected to the circuit pattern 23d1 by a bonding wire 38d. The circuit pattern 23d2 is connected to a control terminal 36a by a bonding wire 38e. The circuit pattern 23d1 is connected to a control terminal 36a by a bonding wire 38f. The sense electrodes 25a3 of the semiconductor chip 25a (located near the frame-portion short side 31b) are connected to the other control terminals 36a by bonding wires 38g.

In addition, the control electrode 25b1 of the semiconductor chip 25b (located near the frame-portion short side 31a) is connected to the circuit pattern 23e2 by a bonding wire 38a. The main electrode 25b2 of the semiconductor chip 25b (located near the frame-portion short side 31a) is connected to the circuit pattern 23e1 by a bonding wire 38b. The control electrode 25b1 of the semiconductor chip 25b (located near the frame-portion short side 31b) is connected to the circuit pattern 23e2 by a bonding wire 38c. The main electrode 25b2 of the semiconductor chip 25b (located near the frame-portion short side 31b) is connected to the circuit pattern 23e1 by a bonding wire 38d. A control terminal 36b is connected to the circuit pattern 23e1 by a bonding wire 38e. A control terminal 36a is connected to the circuit pattern 23e2 by a bonding wire 38f. The sense electrodes 25b3 of the semiconductor chip 25b (located near the frame-portion short side 31b) are connected to the other control terminals 36b by bonding wires 38g.

When the bonding wires 38a to 38g do not need to be distinguished from each other, any one of the bonding wires 38a to 38g will be referred to as a bonding wire 38. These bonding wires 38 are each made of metal material such as aluminum or copper having excellent electrical conductivity or an alloy containing at least one of these kinds, for example. Preferably, the bonding wires 38 each have a diameter between 100 μm and 1.00 mm, inclusive. In FIG. 10, the reference characters of the components of the semiconductor chips 25a and 25b and the insulating circuit board 21 included in the semiconductor unit 20 are not illustrated. These reference characters are illustrated in FIGS. 8 and 9.

Next, a coating step of coating the semiconductor unit 20 in the case 30 with a coating layer is performed (step S6 in FIG. 3). The coating is achieved by spraying coating material to the inside of the storage portion 32 of the case 30.

The coating material contains thermosetting resin as its main component. Examples of the thermosetting resin include polyimide resin, polyamide imide resin, polyamide resin, polyether amide resin, and a modified product thereof. These kinds of thermosetting resin may be suitably used as a surface protection material or an insulating layer for the semiconductor unit 20. Polyamide resin or polyamide imide resin may be used as the coating material more preferably. Since hardening processing at a high temperature is not needed for polyamide resin and polyamide imide resin, it is possible to form the coating material only by performing solvent drying processing at 200° C. or lower.

Other than spraying, a different known coating (application) method such as screen printing, dispenser application, or brush coating may alternatively be used as the coating method. This coating is performed in a non-reduced pressure state. The pressure (coating pressure) applied when the coating layer is formed may be atmospheric pressure, for example, between $0.5 \times 10^5$ Pa and $1.5 \times 10^5$ Pa, inclusive.

After the coating material is sprayed to the semiconductor unit 20 stored in the storage portion 32 of the case 30, the coating material is dried at a predetermined temperature for a predetermined time. As a result, the solvent (for example, diluent material) included in the coating material is volatilized, and for example, a coating layer 51 with which the semiconductor unit 20 is coated is formed, as illustrated in FIG. 11. After dried in this way, it is preferable that the coating layer 51 have a thickness between 0.1 μm and 20 μm, inclusive. The thickness is, more preferably, between 0.2 μm and 5 μm, inclusive, even more preferably, between 0.3 μm and 10 μm, inclusive, and particularly preferably between 0.5 μm and 7 μm, inclusive. If the coating layer 51 has a thickness less than 0.1 μm, since the adhesivity of the coating layer 51 easily deteriorates, the effect of maintaining the adhesion between the sealing material and the semiconductor unit 20 easily deteriorates. Thus, the coating layer 51 having a thickness less than 0.1 μm is not preferable. If the coating layer has a thickness more than 20 μm, the coating material is not easily dried, and the solvent easily remains in the dried coating layer 51. Thus, since the adhesion reliability of the sealing material 40 in a reliability test easily deteriorates, the coating layer having a thickness more than 20 μm is not preferable.

In this way, the coating layer 51 is formed on the semiconductor unit 20, the bonding wires 38, and the inner surfaces of the storage portion 32 in the storage portion 32 of the case 30. The coating layer 51 is also formed on the P connection portion 33a connected to the P terminal 33, the N connection portion 34a connected to the N terminal 34, and the M connection portion 35a connected to the M terminal 35.

As described above, the semiconductor chip 25 and the circuit front surface 23f of the circuit pattern 23 including the surrounding area 50b are coated with the coating layer 51, as illustrated by the example in FIG. 11. The side portions of the bonding material 27 between the outer peripheral portions of the semiconductor chip 25 and the outer peripheral portions of the concave portion 50 of the circuit front surface 23f are also coated with the coating layer 51.

The surrounding area 50b of the disposition area 50a (the concave portion 50) is located at a higher level than the disposition area 50a. Thus, the surrounding area 50b is closer to the outer peripheral portions of the semiconductor chip 25. In addition, the rear surface of the coating layer 51 covering the circuit front surface 23f and the semiconductor chip 25 is supported by the surrounding area 50b. In addition, the coating with the coating layer 51 is performed in a non-reduced pressure state (for example, under atmospheric pressure). Thus, the coating layer 51 will not be pulled into the opening of the cavity 27b in the side portion of the bonding material 27. Thus, the coating layer 51 coats the side portion of the bonding material 27 without being ripped at the cavity 27b formed in the side portion of the bonding material 27.

Next, a sealing step of sealing the storage portion 32 of the case 30 with sealing material is performed (step S7 in FIG. 3). The pressure applied to the storage portion 32 of the case 30 is reduced from the coating pressure to a predetermined pressure. Under the reduced pressure, the sealing material 40 is discharged from a dispenser to the storage portion 32 to fill the storage portion 32 with the sealing material 40. The pressure for this sealing (sealing pressure) is lower than the atmospheric pressure. The sealing pressure is, for example, between $1.0 \times 10^3$ Pa and $1.0 \times 10^4$ Pa, inclusive. The sealing material 40 injected under the sealing pressure coats the coating layer 51 in the storage portion 32 and spreads in the entire storage portion 32 while preventing occurrence of voids. Even if the bonding material 27 has a cavity 27b, since the cavity 27b is covered by the coating layer 51, the sealing material 40 is prevented from entering the cavity 27b. This point will be described in detail below.

When the sealing material 40 injected into the storage portion 32 as described above is hardened, the storage portion 32 is sealed with the coating layer 51 and the sealing material 40, and as a result, the semiconductor device 10 illustrated in FIG. 1 is obtained. In addition, during the sealing, the hardening is accelerated by heating the sealing material 40 as needed. The pressure may be reduced to the sealing pressure when or after the sealing material 40 is discharged from the dispenser or when the sealing material 40 is hardened. That is, the sealing step includes performing sealing under the sealing pressure lower than the coating pressure.

The manufacturing method in FIG. 3 according to the first embodiment has been described as a suitable example in which the coating step in step S6 is performed immediately before the sealing step in step S7. The present embodiment is not limited to this example. The coating step in step S6 in which the cavity 27b is coated with the coating layer 51 may be performed at any timing between the bonding step in step S3 and the sealing step in step S7.

When the sealing is performed as described above, for example, as illustrated in FIG. 12, the sealing material 40 seals the coating layer 51 coating the circuit pattern 23 including the surrounding area 50b and the semiconductor chip 25. The coating layer 51 has high adhesion with respect to the sealing material 40. Thus, the sealing material 40 seals the inside of the storage portion 32 while preventing occurrence of peeling. In addition, the opening of the cavity 27b in the side portion of the bonding material 27 is coated with the coating layer 51. Thus, the sealing material 40 seals the inside of the storage portion 32 without entering the cavity 27b.

Figure 13:
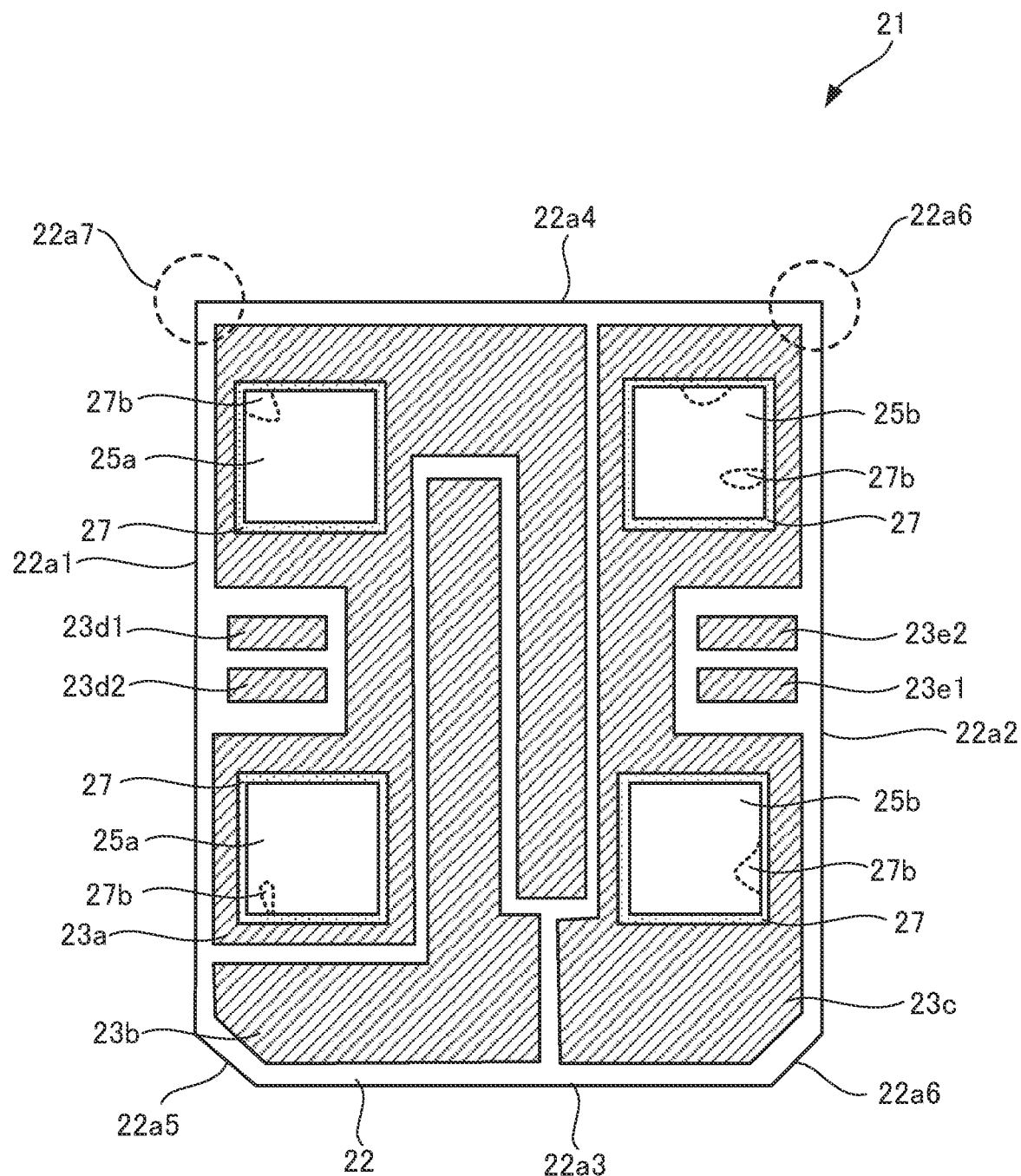
FIG. 13 illustrates a bonding step included in a semiconductor device manufacturing method according to a comparative example.
Figure 14A:
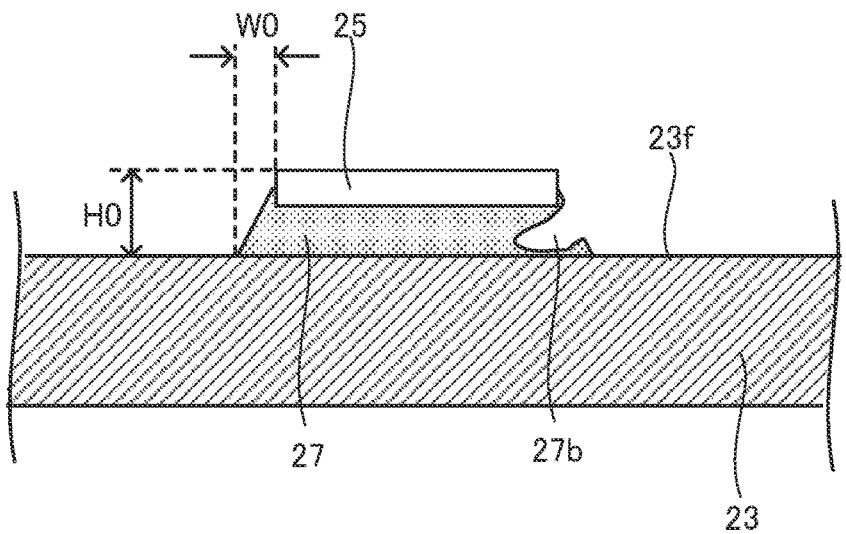
FIGS. 14A to 14C each illustrate the bonding step and a coating step included in the semiconductor device manufacturing method according to the comparative example.
Figure 14B:
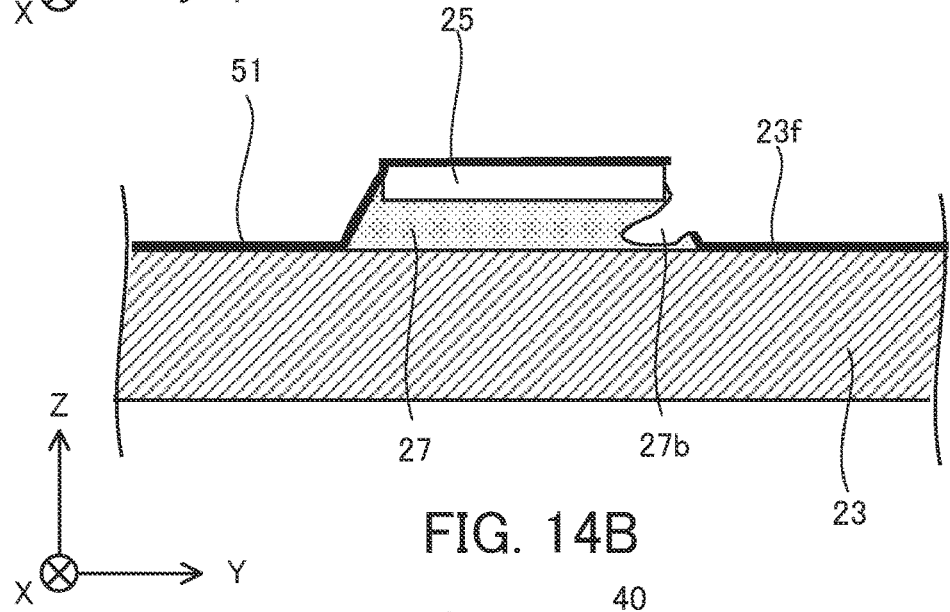
Figure 14C:
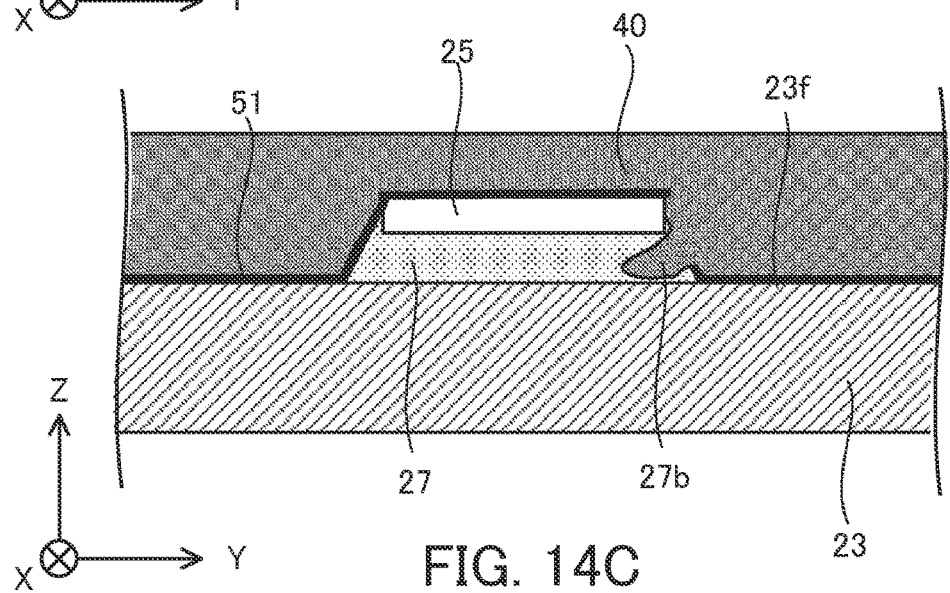

Next, a comparative example, which will be compared against the manufacturing method of the above semiconductor device 10, will be described with reference to FIG. 13 and FIGS. 14A to 14C. In this comparative example, the concave portions 50 are not formed. FIG. 13 illustrates a bonding step included in a semiconductor device manufacturing method according to a comparative example. FIGS. 14A to 14C each illustrate the bonding step and a coating step included in the semiconductor device manufacturing method according to the comparative example. A semiconductor device 10 according to the comparative example does not include the concave portions 50 of the above semiconductor device 10. Specifically, the insulating circuit board 21 according to the comparative example has the same components as those of the insulating circuit board 21 according to the first embodiment, except for the concave portions 50, and the same components will be denoted by the same reference characters. Thus, the first embodiment may be referred to, for what is the same between the semiconductor device 10 and the manufacturing method thereof according to the comparative example and the semiconductor device 10 and the manufacturing method thereof according to the first embodiment.

As described above, in the case of the insulating circuit board 21 according to the comparative example, too, a cavity 27b is easily formed in a side portion of the bonding material 27 to which the semiconductor chip 25a or 25b is bonded, the side portion being near an outer peripheral portion of the insulating circuit board 21. For example, as illustrated in FIG. 13, cavities 27b as indicated by dashed lines could be formed in the bonding material 27 under the semiconductor chips 25a and 25b.

In addition, according to the comparative example, as illustrated in FIG. 14A, no concave portion 50 is formed, and the circuit front surface 23f (disposition area 50a) of the circuit pattern 23 and the surrounding area 50b are on the same plane. In this comparative example, the length from the circuit front surface 23f (surrounding area 50b) to the front surface of the semiconductor chip 25 is a height H0. In addition, the length from an outer peripheral portion of the semiconductor chip 25 to an outer peripheral portion of the bonding material 27 is a width W0. In addition, as illustrated in FIG. 14A, the entire opening of the cavity 27b is exposed from a side portion of the bonding material 27 between the circuit pattern 23 and the semiconductor chip 25.

As in the above embodiment, to improve the adhesion of the sealing material 40, first, the coating layer 51 is formed in the storage portion 32 in which the insulating circuit board 21 as described above is stored. As illustrated in FIG. 14B, the coating layer 51 continuously coats the circuit front surface 23f of the circuit pattern 23, one side portion of the bonding material 27 (one side portion in which no cavity 27b is formed), and the front surface of the semiconductor chip 25.

Another side portion of the bonding material 27 is also coated with the coating layer 51 temporarily. However, since the coating layer 51 is not supported in the opening area of the cavity 27b in this side portion of the bonding material 27, the coating layer 51 in this opening area is ripped, and a hole is made in the coating layer 51. In particular, when the coating layer 51 has a thickness less than 1 μm, the coating layer 51 is easily ripped. In addition, the height H0 and the width W0 are larger than the height H1 and the width W1 in FIGS. 7A and 7B. Thus, even when the opening area of the cavity 27b has the same size as that illustrated in FIGS. 7A and 7B, since there is no concave portion 50, a larger opening area is exposed, compared with the case in FIGS. 7A and 7B. Thus, since the coating layer 51 is not supported in the opening area of the cavity 27b in this side portion of the bonding material 27, the coating layer 51 is easily ripped in this area.

If the storage portion 32 including the coating layer 51 having a hole is sealed with the sealing material 40, the sealing material 40 flows through the hole in the coating layer 51 and enters the cavity 27b, as illustrated in FIG. 14C. If the semiconductor device 10 in this state is repeatedly heated or cooled, the sealing material 40 inside the cavity 27b under the semiconductor chip 25 expands or contracts. Thus, since stress is applied to the semiconductor chip 25, the probability that the semiconductor chip 25 will be damaged or malfunction is increased. As a result, the reliability of the semiconductor device 10 deteriorates.

Thus, the above manufacturing method of the semiconductor device 10 according to the first embodiment includes preparing components of the semiconductor device 10, forming the concave portion 50 in the disposition area 50a of the circuit pattern 23, and introducing the surrounding area 50b (supporting portion) located at a higher level than the disposition area 50a around the disposition area 50a. In addition, the above manufacturing method of the semiconductor device 10 includes applying the bonding material 27 in the disposition area 50a, bonding the semiconductor chip 25 to the disposition area 50a via the bonding material 27, and coating the circuit front surface 23f including the semiconductor chip 25 and the surrounding area 50b with the coating layer 51 in plan view of the circuit pattern 23. In addition, the above manufacturing method of the semiconductor device 10 includes sealing the circuit front surface 23f of the circuit pattern 23 coated with the coating layer 51 with the sealing material 40, the circuit front surface 23f including the semiconductor chip 25 and the surrounding area 50b in plan view.

According to the first embodiment, the surrounding area 50b of the circuit pattern 23 is located at a higher level than the disposition area 50a. Thus, the height H1 (see FIG. 7A) is smaller than the height H0 (see FIG. 14A) according to the comparative example. Thus, the rear surface of the coating layer 51 coating the cavity 27b formed in the side portion of the bonding material 27 is supported by the surrounding area 50b as the supporting portion. As a result, the coating layer 51 covering the opening area of the cavity 27b coats the circuit front surface 23f including the semiconductor chip 25, the side portions of the bonding material 27, and the surrounding area 50b in plan view of the circuit pattern 23, without being ripped. The coating layer 51 prevents the sealing material 40 from entering the cavity 27b. If the height H1 and the width W1 are too large, the cavity 27b could have a larger opening area exposed to the outside, and therefore, the coating layer 51 could be ripped. Thus, it is preferable that the height H1 be between 20% and 80%, inclusive, of the depth of the concave portion 50. In addition, the height H1 may be between 10% and 120%, inclusive, of the thickness of the semiconductor chip 25. Preferably, the height H1 is between 50% and 100%, inclusive, of the thickness. The width W1 may be half of the difference between the length of one side of the semiconductor chip 25 and the length of one side of the disposition area 50a. The width W1 may be between 0% and 15%, inclusive, of the length of one side of the semiconductor chip 25. It is preferable that the width W1 be between 5% and 10%, inclusive, of the half of the length of one side of the semiconductor chip 25.

The adhesion of the sealing material 40 is improved by the coating layer 51, occurrence of peeling is prevented, and the inside of the storage portion 32 of the case 30 is sealed without fail. Since the sealing material 40 dose not enter the cavity 27b, even when the temperature change occurs, stress that causes damage to the semiconductor chip 25 does not occur. Thus, deterioration of the reliability of the semiconductor device 10 is prevented.

Variation 1

Hereinafter, variation 1 of the first embodiment will be described with reference to FIGS. 15 and 16. Variation 1 corresponds to a case in which the surrounding area 50b of the circuit front surface 23f of the circuit pattern 23 described in the first embodiment is formed to protrude from the circuit front surface 23f when the concave portion 50 is formed through metal processing.

Figure 15:
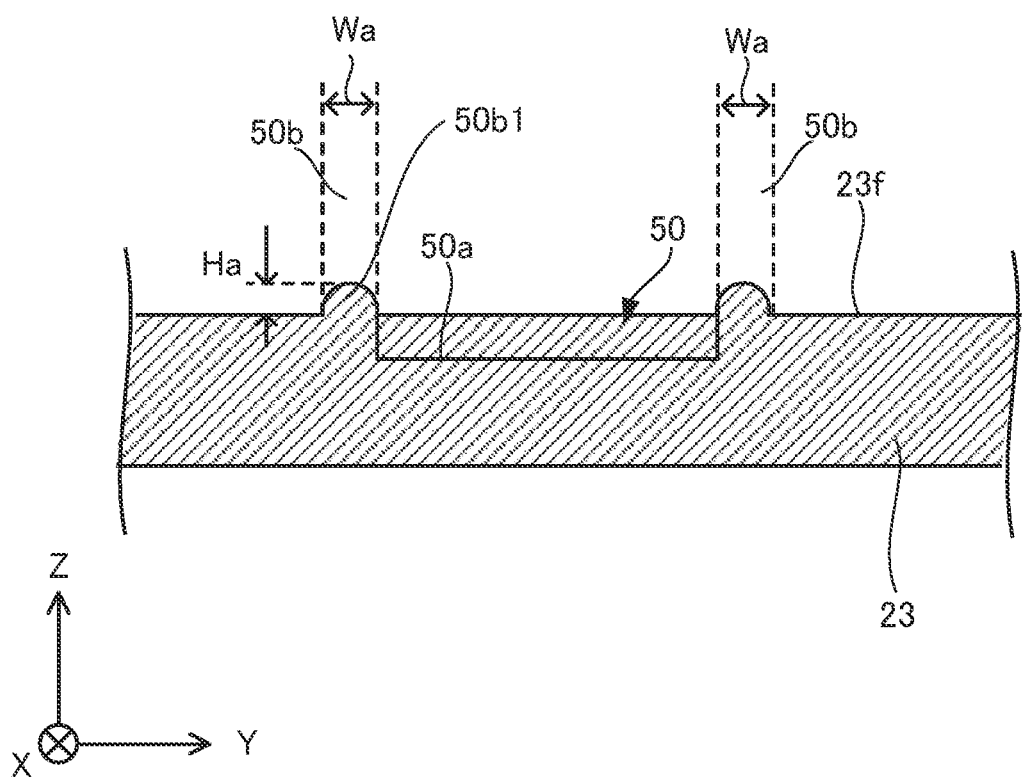
FIG. 15 illustrates an introduction step included in a semiconductor device manufacturing method according to variation 1 of the first embodiment.

FIG. 15 illustrates an introduction step included in a semiconductor device manufacturing method according to variation 1 of the first embodiment. FIG. 16 illustrates a coating step and a sealing step included in the semiconductor device manufacturing method according to variation 1 of the first embodiment. FIG. 15 corresponds to the sectional view in FIG. 5A. The plan view of FIG. 15 corresponds to FIG. 5B. FIG. 16 corresponds to FIG. 12. FIG. 16 without the sealing material 40 corresponds to FIG. 11.

As described above, in step S2 in FIG. 3, metal processing is performed on the disposition area 50a of the circuit front surface 23f of the circuit pattern 23, to form the concave portion 50. As a result, when the concave portion 50 is formed, the surrounding area 50b could protrude (could be raised) from the circuit front surface 23f, as illustrated in FIG. 15. That is, a protruding portion 50b1 protruding in the +Z direction is formed in the surrounding area 50b. The protruding portion 50b1 is formed as a supporting portion in a continuous ring along the surrounding area 50b.

It is preferable that a height Ha of the protruding portion 50b1 from the circuit front surface 23f be between 20% and 80%, inclusive, of the depth of the concave portion 50, for example. A width Wa of the protruding portion 50b1 does not necessarily need to be equal to the width of the surrounding area 50b. The width Wa may be wider or narrower than the width of the surrounding area 50b. It is preferable that the width Wa of the protruding portion 50b1 be between 5% and 20%, inclusive, of the width (the length of one length) of the concave portion 50, for example. As long as the protruding portion 50b1 having a ring shape has substantially a uniform height Ha and a uniform width Wa as a whole, the height Ha and the width Wa may vary at some portions of the protruding portion 50b1.

Next, a bonding step of bonding the semiconductor chip 25 in the disposition area 50a of the circuit pattern 23 is performed (step S3 in FIG. 3). In this case, too, as in the case illustrated in FIGS. 6A and 6B and FIGS. 7A and 7B, the semiconductor chip 25 is bonded in the disposition area 50a via the bonding material 27. However, in this case, the protruding portion 50b1 is continuously formed in a ring around the semiconductor chip 25. Thus, the protruding portion 50b1 prevents the paste bonding material 27a from spreading. In addition, in this case, too, as in the case illustrated in FIGS. 7A and 7B, a cavity 27b extending from a side portion of the bonding material 27 to the inside of the bonding material 27 could be formed.

The front surface (chip front surface) of the semiconductor chip 25 bonded as described above is located at a higher level than the highest point of the protruding portion 50b1. The length from the highest point of the protruding portion 50b1 to the front surface of the semiconductor chip 25 will be referred to as a height Hb. In addition, the length from an outer periphery portion of the semiconductor chip 25 to an inner edge portion of the protruding portion 50b1 will be referred to as a width Wb (see the height Hb and the width Wb in FIG. 16). A side portion of the bonding material 27 bonding the semiconductor chip 25 and the disposition area 50a (the circuit pattern 23) is gradually inclined between the outer peripheral portion of the semiconductor chip 25 and the disposition area 50a. A cavity 27b could be formed in a part of the side portion of the bonding material 27, as in the first embodiment (see the cavity 27b in FIG. 16).

In addition, as in the first embodiment, the lead frames 26a and 26b are also bonded to the semiconductor chips 25a and 25b and the circuit patterns 23a and 23b via bonding material (not illustrated). As illustrated in FIG. 9, the semiconductor unit 20 including the insulating circuit board 21 on which the semiconductor chips 25a and 25b and the lead frames 26a and 26b have been bonded in this order is obtained.

Next, a storage step of storing the semiconductor unit 20 in the case 30 and a wiring step of wiring the semiconductor unit 20 and the control terminals 36a and 36b via bonding wires are performed (steps S3 and S4 in FIG. 3).

Next, a coating step of coating the semiconductor unit 20 in the case 30 with a coating layer is performed (step S6 in FIG. 3). As in the first embodiment, the inside of the storage portion 32 in the case 30 is coated with a coating layer 51 by spraying coating material under atmospheric pressure (coating pressure) to the inside of the storage portion 32 and drying the coating material.

Figure 16:
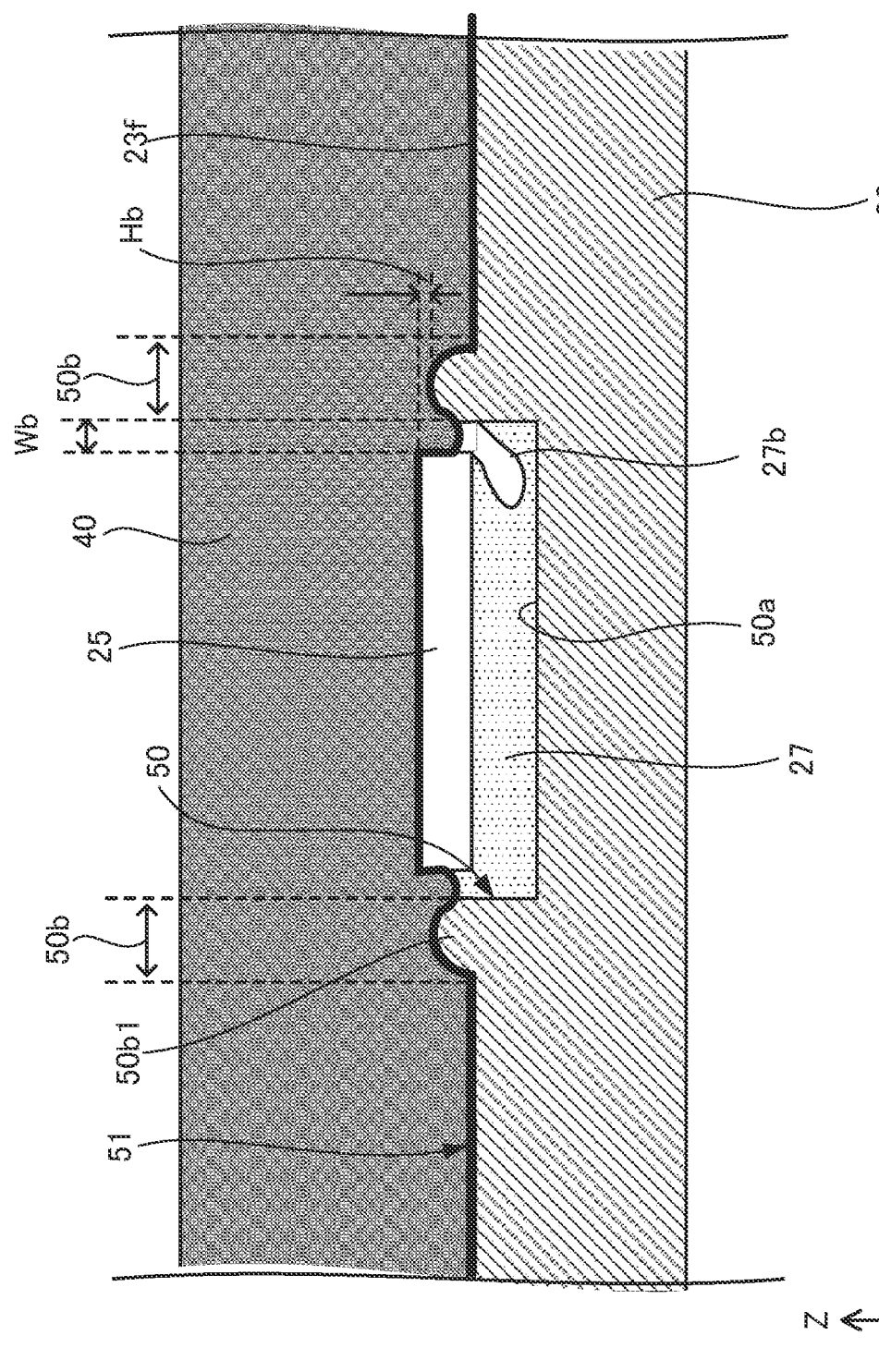
FIG. 16 illustrates a coating step and a sealing step included in the semiconductor device manufacturing method according to variation 1 of the first embodiment.

The semiconductor chip 25 and the circuit front surface 23f of the circuit pattern 23 including the protruding portion 50b1 in the surrounding area 50b are coated with the coating layer 51 (see the coating layer 51 in FIG. 16). The coating layer 51 is supported by the protruding portion 50b1 between an outer peripheral portion of the semiconductor chip 25 and the circuit front surface 23f. Thus, the coating layer 51 gradually coats the area between the outer peripheral portion of the semiconductor chip 25 and the circuit front surface 23f. Consequently, a void is included between the coating layer 51 and the bonding material 27. The coating with the coating layer 51 is also performed under atmospheric pressure. Thus, the coating layer 51 is not pulled into the opening of the cavity 27b in the side portion of the bonding material 27. As a result, the coating layer 51 covers the opening of the cavity 27b in the side portion of the bonding material 27.

Next, a sealing step of sealing the storage portion 32 of the case 30 with sealing material is performed (step S7 in FIG. 3). As in the first embodiment, the storage portion 32 of the case 30 is filled with the sealing material 40. As in the first embodiment, even if a cavity 27b is formed in the bonding material 27, since the cavity 27b is covered by the coating layer 51, the sealing material 40 is prevented from entering the cavity 27b.

By hardening the sealing material 40 with which the storage portion 32 has been filled, the storage portion 32 is sealed with the sealing material 40, and the semiconductor device 10 illustrated in FIG. 1 is obtained. As needed, the hardening may be accelerated by heating. In this case, too, the pressure may be reduced to the sealing pressure when or after the sealing material 40 is discharged from the dispenser or when the sealing material 40 is hardened.

In addition, the protruding portion 50b1 of the circuit pattern 23 is located at a higher level than the disposition area 50a. Thus, the height Hb (see FIG. 16) is smaller than the height H0 according to the comparative example (see FIG. 14A). Thus, the rear surface of the coating layer 51 covering the cavity 27b formed in the side portion of the bonding material 27 is supported by the protruding portion 50b1. As a result, the coating layer 51 covering the opening area of the cavity 27b coats the circuit front surface 23f including the semiconductor chip 25, the side portions of the bonding material 27, and the protruding portion 50b1 in plan view of the circuit pattern 23, without being ripped. The coating layer 51 prevents the sealing material 40 from entering the cavity 27b.

If the height Hb and the width Wb are too large, the cavity 27b could have a larger opening area exposed to the outside, and therefore, the coating layer 51 could be ripped. Thus, it is preferable that the height Hb be between 10% and 120%, inclusive, of the height of the semiconductor chip 25. In addition, the height Hb may be between 10% and 120%, inclusive, of the thickness of the semiconductor chip 25. Preferably, the height Hb is between 50% and 100%, inclusive, of the thickness. If the protruding portion 50b1 is too far away from a side portion of the bonding material 27, the coating layer 51 could be ripped between the corresponding outer periphery portion of the semiconductor chip 25 and the protruding portion 50b1. Thus, the width Wb from the side portion of the bonding material 27 to the inner side of the protruding portion 50b1 is more than 0 mm and less than or equal to 0.5 mm, for example.

The adhesion of the sealing material 40 is improved by the coating layer 51, occurrence of peeling is prevented, and the inside of the storage portion 32 of the case 30 is sealed without fail. Since the sealing material 40 does not enter the cavity 27b, even when the temperature change occurs, stress that causes damage to the semiconductor chip 25 does not occur. Thus, deterioration of the reliability of the semiconductor device 10 is prevented.

Second Embodiment

Next, a second embodiment in which ripping of the coating layer 51 is prevented without forming the concave portion 50 in the circuit pattern 23 will be described. A semiconductor device 10 according to the second embodiment includes the same components as those of the semiconductor device 10 according to the first embodiment, except for the concave portions 50, and the same components will be denoted by the same reference characters. The semiconductor device 10 according to the second embodiment includes supporting portions 52.

Figure 17A:
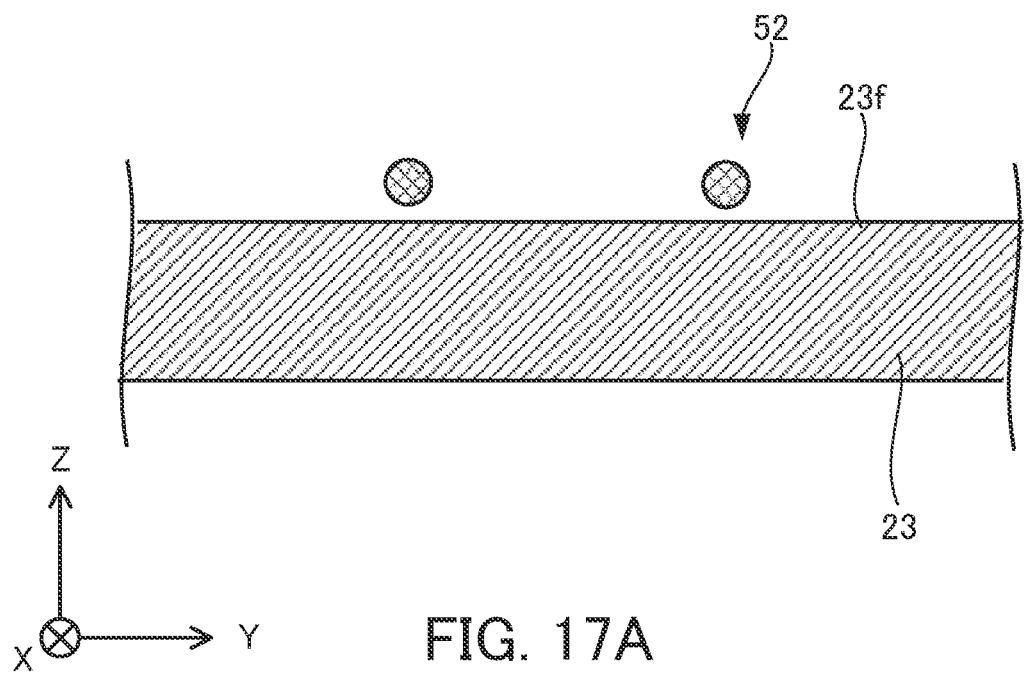
FIGS. 17A and 17B each illustrate an introduction step included in a semiconductor device manufacturing method according to a second embodiment.
Figure 17B:
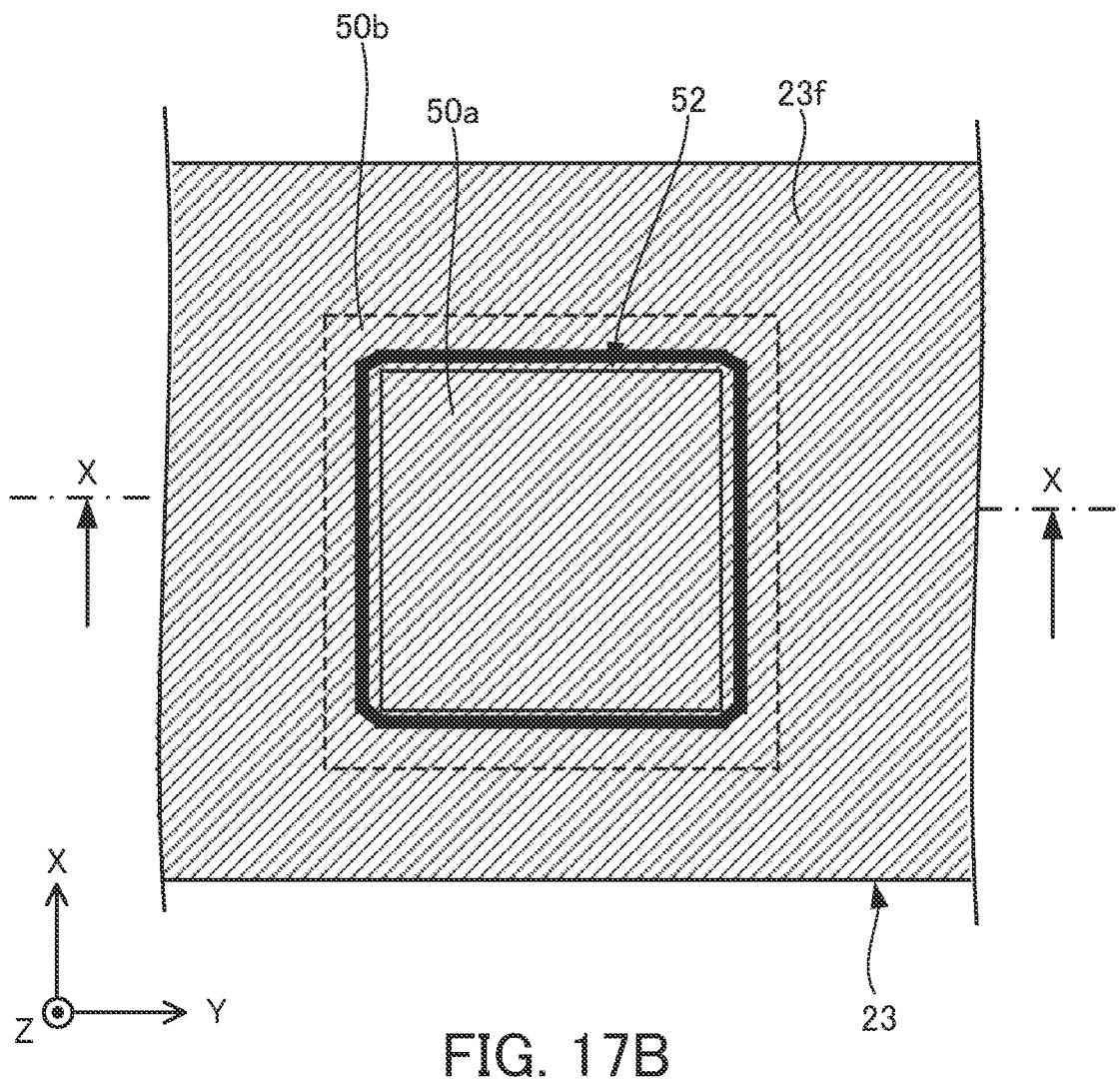
Figure 18A:
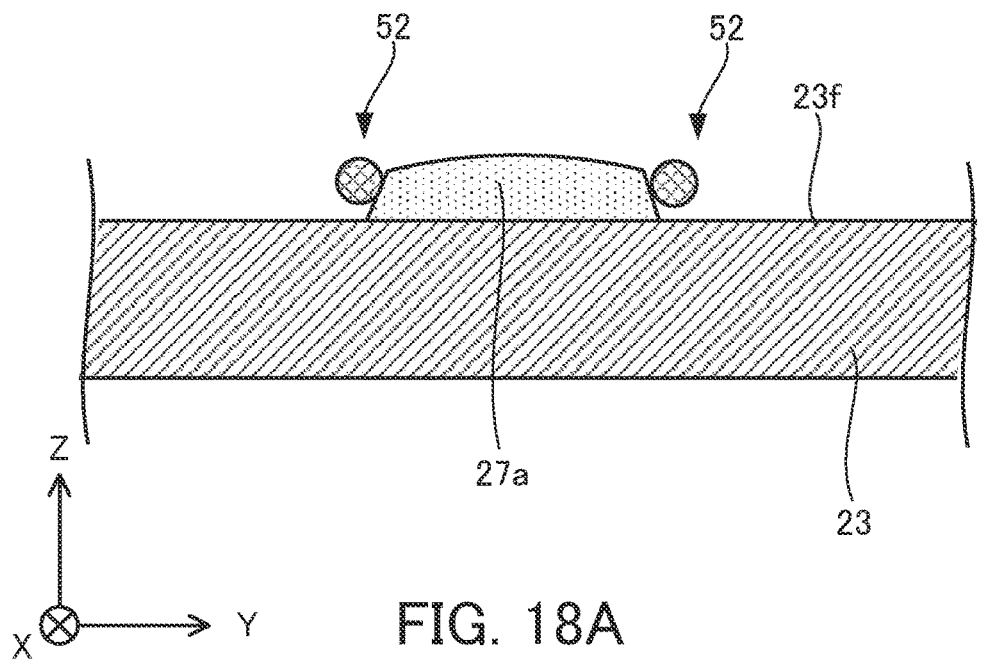
FIGS. 18A and 18B each illustrate a bonding step included in the semiconductor device manufacturing method according to the second embodiment (part 1)
Figure 18B:
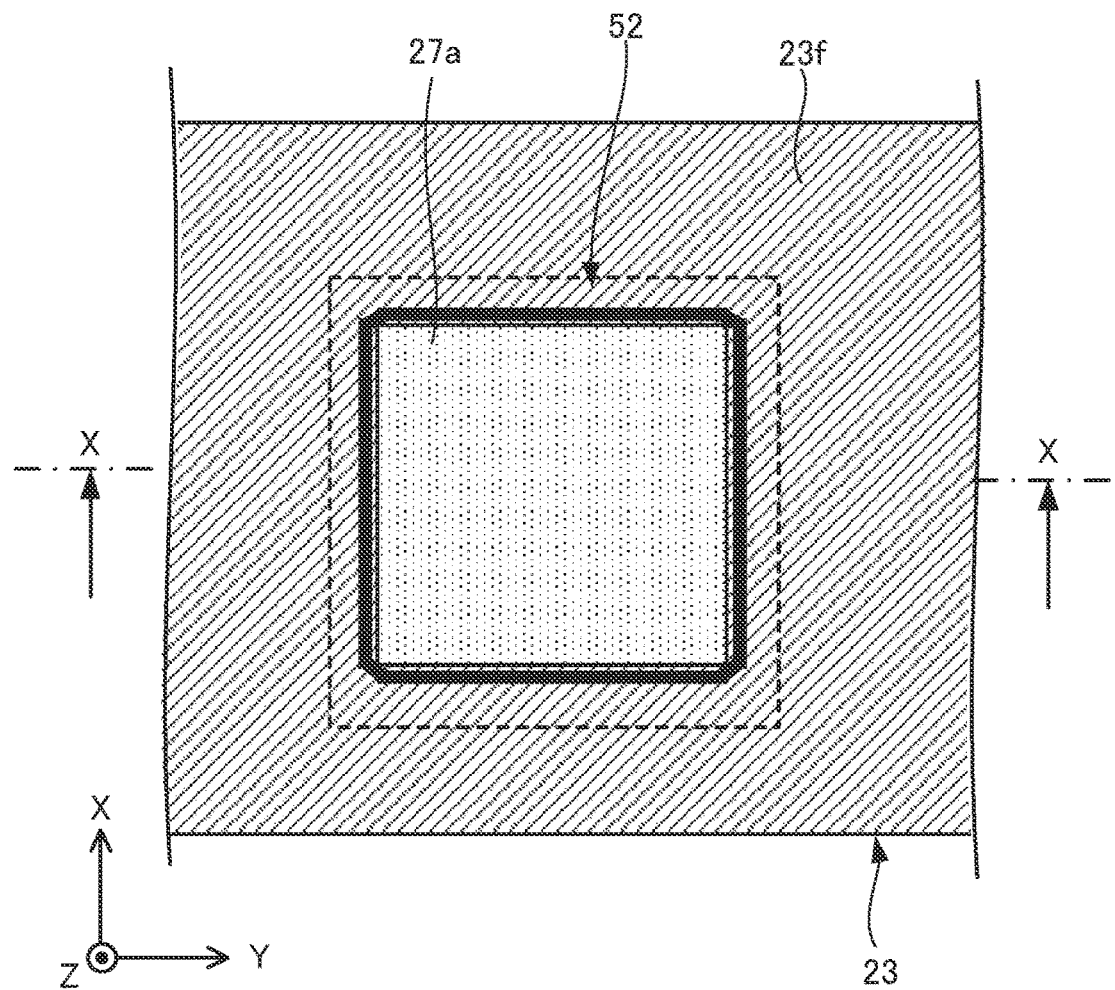
Figure 19A:
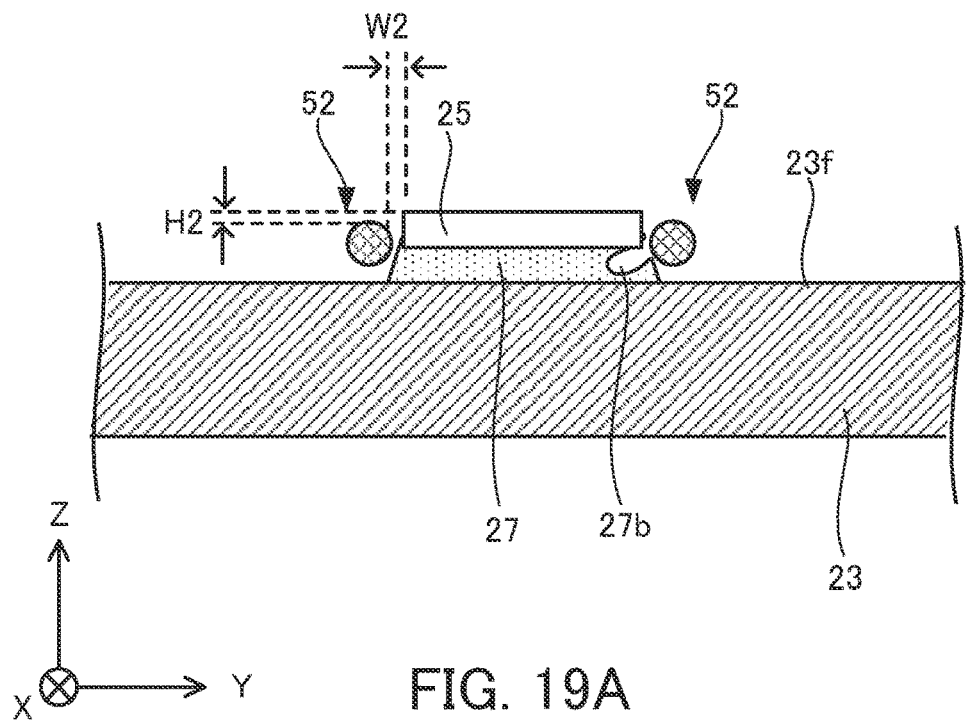
FIGS. 19A and 19B each illustrate the bonding step included in the semiconductor device manufacturing method according to the second embodiment (part 2)
Figure 19B:
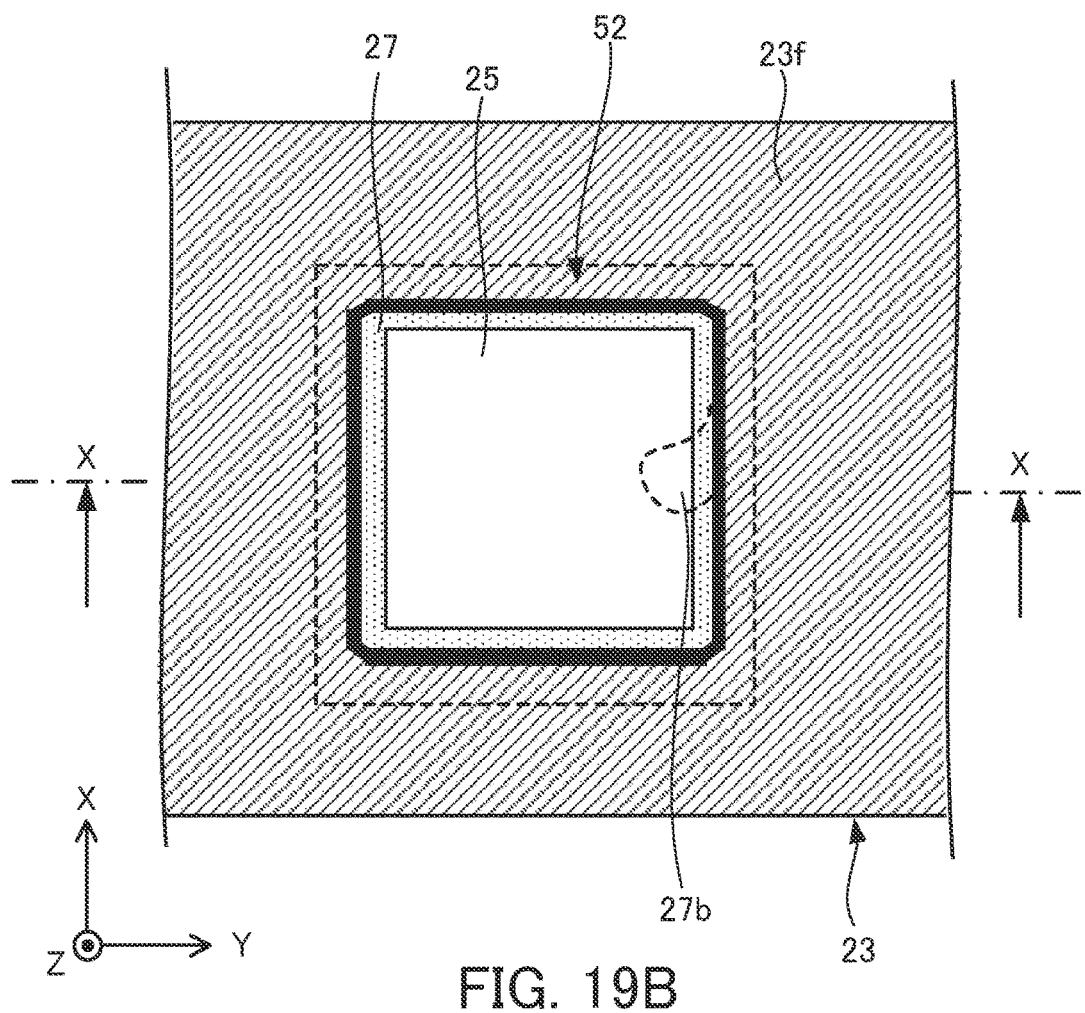
Figure 20:
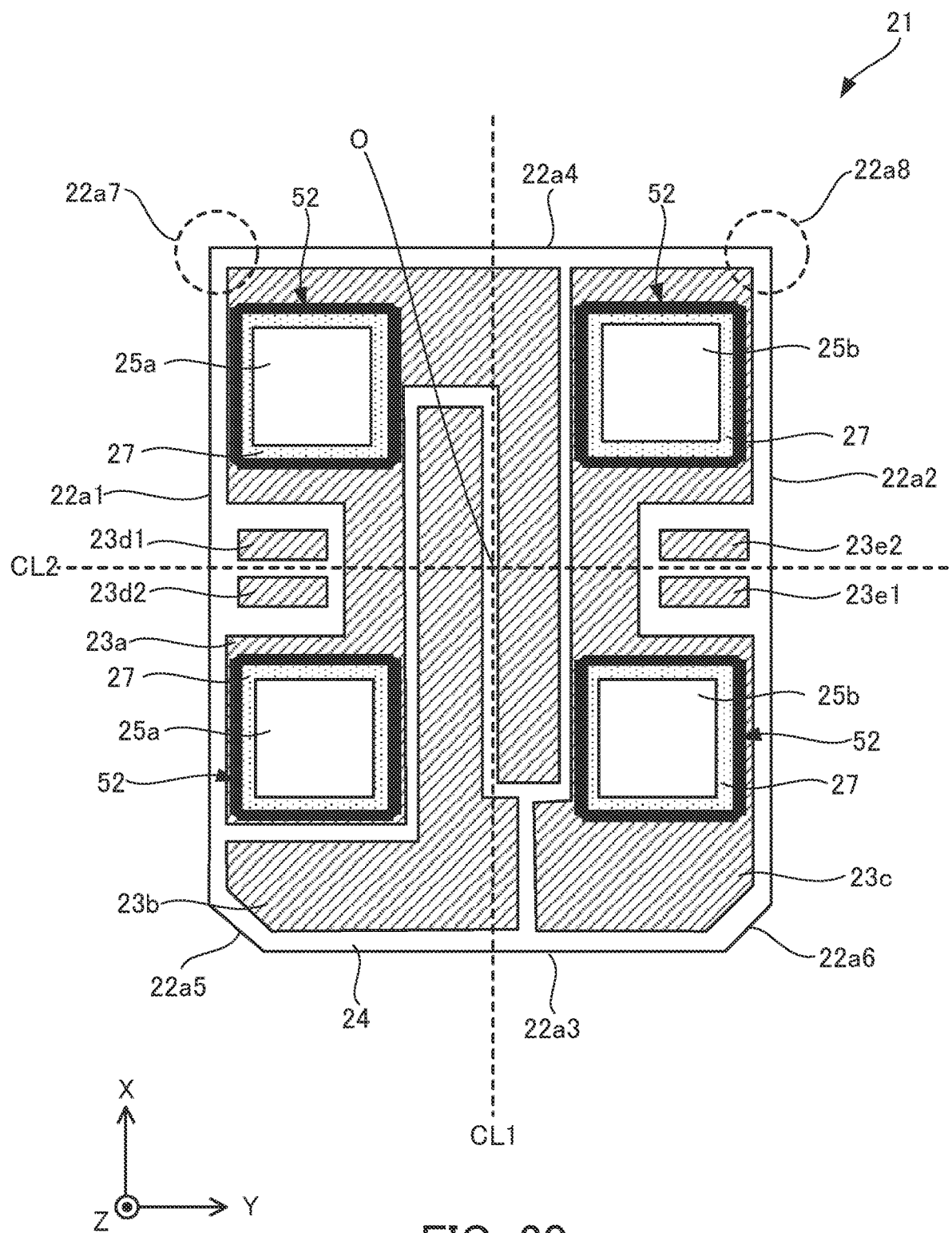
FIG. 20 is a plan view of a semiconductor unit included in a semiconductor device according to the second embodiment.
Figure 21:
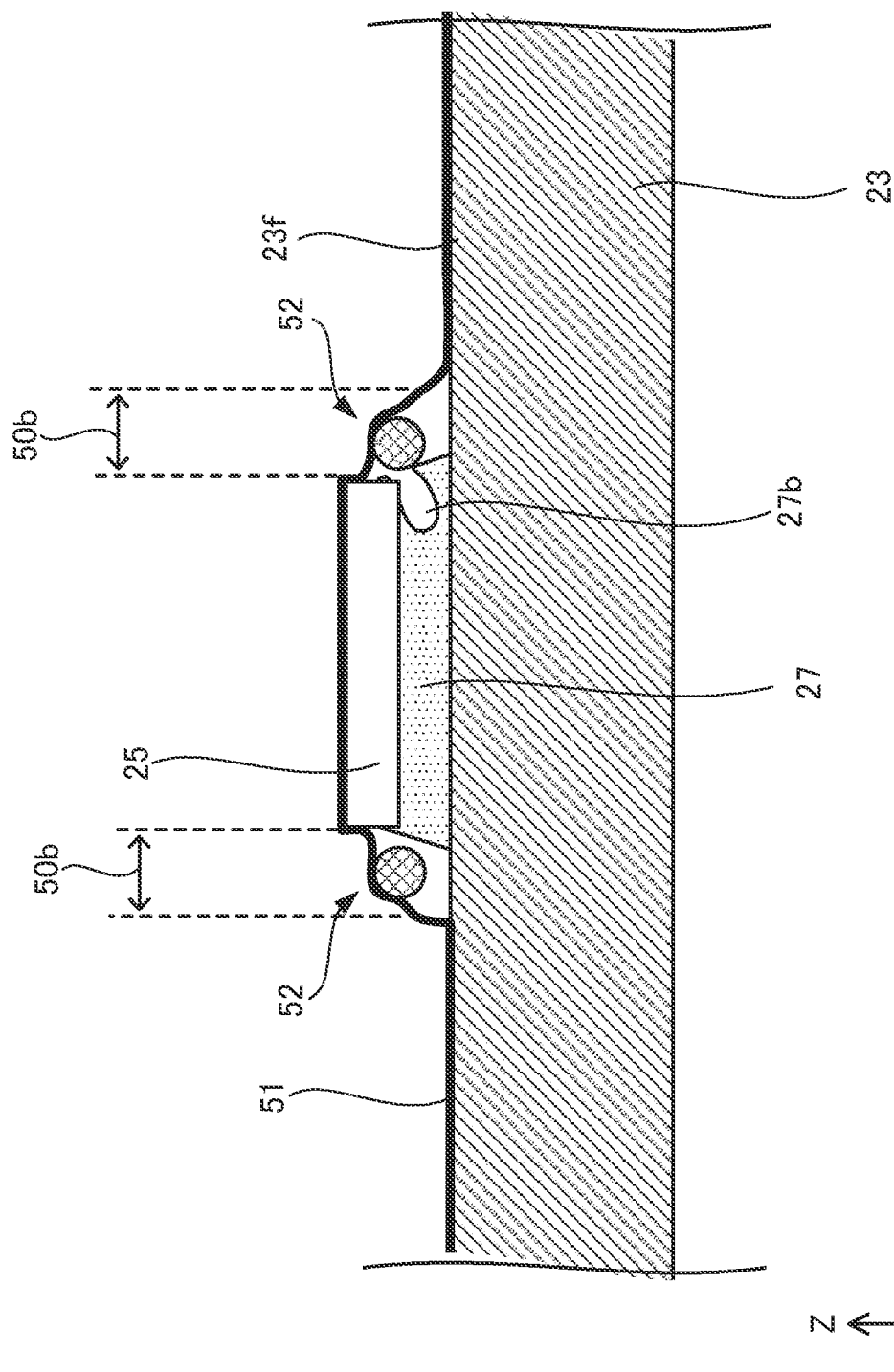
FIG. 21 illustrates a coating step included in the semiconductor device manufacturing method according to the second embodiment.
Figure 22:
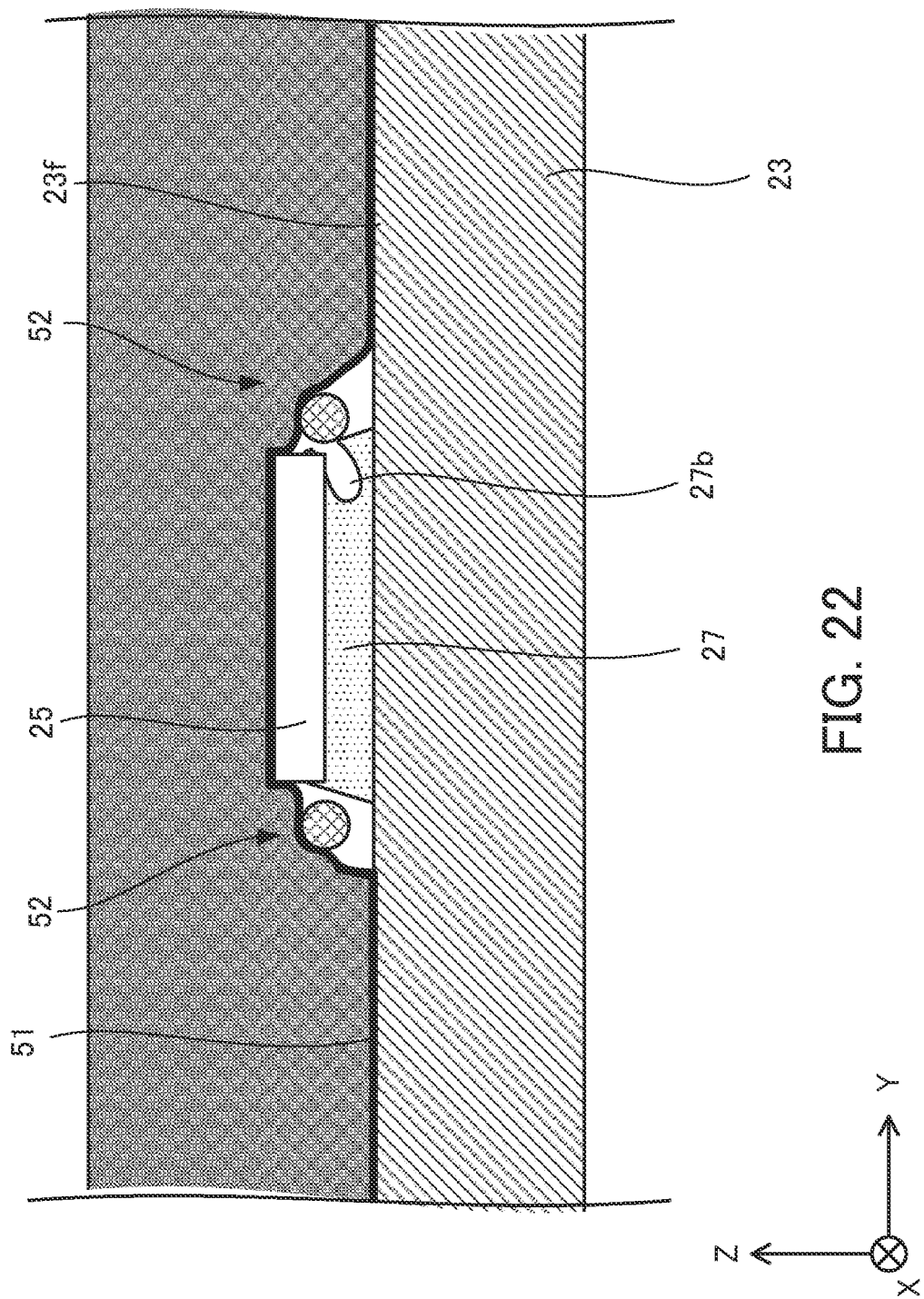
FIG. 22 illustrates a sealing step included in the semiconductor device manufacturing method according to the second embodiment.

A manufacturing method of the semiconductor device 10 according to the second embodiment will be described with reference to FIGS. 17A to 22 and FIG. 3. FIGS. 17A and 17B each illustrate an introduction step included in the semiconductor device manufacturing method according to the second embodiment. FIGS. 18A and 18B and FIGS. 19A and 19B each illustrate a bonding step included in the semiconductor device manufacturing method according to the second embodiment. FIG. 20 is a plan view of a semiconductor unit included in the semiconductor device according to the second embodiment. FIG. 21 illustrates a coating step semiconductor device included in the manufacturing method according to the second embodiment. FIG. 22 illustrates a sealing step included in the semiconductor device manufacturing method according to the second embodiment.

FIGS. 17A to 19B correspond to FIGS. 5A to 7B, respectively. FIGS. 17A, 18A, and 19A are sectional views taken along dashed-dotted lines X-X in FIGS. 17B, 18B, and 19B, respectively. FIGS. 21 and 22 correspond to FIGS. 11 and 12. In FIG. 20, illustration of the lead frames 26a and 26b is omitted.

First, as in the first embodiment, a preparation step is performed (step S1 in FIG. 3). In this step, material of the supporting portions 52 described below is prepared. As the supporting portions 52, for example, wires or resist material is prepared. The supporting portions 52 will be described below.

Next, an introduction step of introducing the supporting portions 52 to the circuit patterns 23a and 23c of the insulating circuit board 21 is performed (step S2 in FIG. 3). As illustrated in FIGS. 17A and 17B, the individual supporting portion 52 is introduced to the surrounding area 50b of the disposition area 50a of the circuit front surface 23f of the circuit pattern 23. The supporting portion 52 is, for example, a wire or resist material. The second embodiment assumes that the supporting portion 52 is a wire. In this case, the wire is also made of the same material as the individual bonding wire 38. The supporting portion 52 is formed in a continuous ring along the surrounding area 50b, as illustrated in FIGS. 17A and 17B. The supporting portion 52 is bonded to the surrounding area 50b (circuit front surface 23f) at corner portions thereof. The supporting portion 52 is floated from the surrounding area 50b at side portions thereof. Alternatively, the supporting portion 52 may be into contact with the surrounding area 50b. In the second embodiment, a single wire is used as the supporting portion 52 as an example. However, the number of wires as the supporting portion 52 is not limited to one. A plurality of wires may be stacked in a plurality of stages. A height H2 to be described below is controllable based on the diameter of the wire or the height of a multi-layer of wires stacked. The individual wire as the individual supporting portion 52 may have a circular or oval cross section. Alternatively, the wire may have a polygonal cross section, and each of the corner portions may be rounded. Even when the supporting portion 52 is covered by the coating layer 51 as described below, the coating layer 51 is prevented from being ripped by the wire.

When resist material is used as the individual supporting portion 52, the resist material is applied to the individual surrounding area 50b continuously in a ring pattern. Alternatively, the supporting portion 52 may be a frame member that is made of metal material and that is formed in a continuous ring. In this case, this frame member may be bonded to the surrounding area 50b along the surrounding area 50b by welding or the like.

Next, a bonding step of bonding the semiconductor chip 25 to the disposition area 50a of the circuit pattern 23 is performed (step S3 in FIG. 3). As illustrated in FIGS. 18A and 18B, paste bonding material 27a is applied to the disposition area 50a of the circuit pattern 23 formed in step S2. The disposition area 50a is surrounded by the supporting portion 52 in four directions. When the paste bonding material 27a is applied to the disposition area 50a, the supporting portion 52 has a function of positioning the paste bonding material 27a and a function of preventing the paste bonding material 27a from spreading. A plate-like bonding material 27a may be disposed on the disposition area 50a, instead of the paste bonding material 27a.

The semiconductor chip 25 is disposed on the disposition area 50a via melted bonding material 27a. The bonding material 27a on which the semiconductor chip 25 has been disposed and which is surrounded by the supporting portion 52 is heated and melted. The melted bonding material 27a is surrounded by the supporting portion 52, which is located at a higher level than the disposition area 50a. Thus, the bonding material 27a does not spread from the disposition area 50a. Thus, by disposing the semiconductor chip 25 on the bonding material 27a, the semiconductor chip 25 is disposed in the disposition area 50a without fail. As described above, the supporting portion 52 also has a function of positioning the semiconductor chip 25 in the disposition area 50a. Next, the bonding material 27a is solidified by cooling. As a result, as illustrated in FIGS. 19A and 19B, the semiconductor chip 25 is bonded to the disposition area 50a via the bonding material 27. In addition, as illustrated in FIG. 20, the semiconductor chips 25a are bonded to the circuit pattern 23a of the insulating circuit board 21, and the semiconductor chips 25b are bonded to the circuit pattern 23c of the insulating circuit board 21.

The front surface (chip front surface) of the semiconductor chip 25 bonded as descried above is located at a higher level than the highest point of the supporting portion 52. The length from the highest point of the supporting portion 52 to the front surface of the semiconductor chip 25 will be referred to the height H2. In addition, the length from an outer periphery portion of the semiconductor chip 25 to an opening edge portion of the supporting portion 52 (an outer periphery portion of the bonding material 27) will be referred to as a width W2. The side portion of the bonding material 27 bonding the semiconductor chip 25 and the disposition area 50a (circuit pattern 23) is gradually inclined between the outer peripheral portion of the semiconductor chip 25 and the disposition area 50a. A cavity 27b could be formed in a part of a side portion of the bonding material 27, as in the first embodiment.

In addition, in the second embodiment, too, when the insulating circuit board 21 on which the semiconductor chips 25a and 25b are disposed via the paste bonding material 27a is cooled, as in the first embodiment, the bonding 27a at the four locations is also cooled material concentrically from the center point O to the outer peripheral portions of the insulating circuit board 21. When the bonding material 27a is cooled this way, the outer peripheral portions thereof corresponding to the outer peripheral portions of the insulating circuit board 21 are cooled last, and a cavity 27b is formed. The opening of such a cavity 27b is exposed from a side portion of the bonding material 27. The height of the opening of the cavity 27b (the length in the +Z directions in FIG. 19A) is up to approximately the height of the side portion of the bonding material 27. In addition, at least a part of the opening of the cavity 27b is covered by the supporting portion 52, for example, as illustrated in FIG. 19A.

As in the first embodiment, the lead frames 26a and 26b are also bonded to the semiconductor chips 25a and 25b and the circuit patterns 23a and 23b via bonding material (not illustrated). Thus, the semiconductor unit 20 including the insulating circuit board 21 on which the semiconductor chips 25a and 25b and the lead frames 26a and 26b have been bonded in this order is obtained.

Next, a coating step of coating the semiconductor unit 20 in the case 30 with a coating layer is performed (step S6 in FIG. 3). As in the first embodiment, the inside of the storage portion 32 in the case 30 is coated with a coating layer 51 by spraying coating material under atmospheric pressure (coating pressure) to the inside of the storage portion 32 and drying the coating material.

For example, as illustrated in FIG. 21, the semiconductor chip 25 and the circuit front surface 23f of the circuit pattern 23 including the supporting portion 52 in the surrounding area 50b are coated with the coating layer 51. The coating layer 51 is supported by the supporting portion 52 between the outer peripheral portions of the semiconductor chip 25 and the circuit front surface 23f. Thus, the coating layer 51 gradually coats the area between the outer peripheral portions of the semiconductor chip 25 and the circuit front surface 23f. Consequently, a void is included between the coating layer 51 and the bonding material 27. The coating with the coating layer 51 is also performed under atmospheric pressure. Thus, the coating layer 51 is not pulled into the opening of the cavity 27b in the side portion of the bonding material 27. As a result, the coating layer 51 covers the opening of the cavity 27b in the side portion of the bonding material 27.

Next, a sealing step of sealing the storage portion 32 of the case 30 with sealing material is performed (step S7 in FIG. 3). As in the first embodiment, the storage portion 32 of the case 30 is filled with the sealing material 40. As in the first embodiment, even if a cavity 27b is formed in the bonding material 27, since the cavity 27b is covered by the coating layer 51, the sealing material 40 is prevented from entering the cavity 27b.

By hardening the sealing material 40 with which the storage portion 32 has been filled, the storage portion 32 is sealed with the sealing material 40, and the semiconductor device 10 illustrated in FIG. 1 is obtained. As needed, the hardening may be accelerated by heating. In this case, too, the pressure may be reduced to the sealing pressure when or after the sealing material 40 is discharged from the dispenser or when the sealing material 40 is hardened.

Thus, the above manufacturing method of the semiconductor device 10 according to the second embodiment includes preparing components of the semiconductor device 10 and introducing the supporting portion 52 to the surrounding area 50b around the disposition area 50a of the circuit pattern 23, the supporting portion 52 being located at a higher level than the disposition area 50a. In addition, the above manufacturing method of the semiconductor device 10 includes applying the bonding material 27 in the disposition area 50a, bonding the semiconductor chip 25 to the disposition area 50a via the bonding material 27, and coating the circuit front surface 23f including the semiconductor chip 25 and the supporting portion 52 with the coating layer 51 in plan view of the circuit pattern 23. In addition, the above manufacturing method of the semiconductor device 10 includes sealing the circuit front surface 23f of the circuit pattern 23 coated with the coating layer 51 with the sealing material 40, the circuit front surface 23f including the semiconductor chip 25 and the supporting portion 52 in plan view.

The supporting portion 52 is located at a higher level than the disposition area 50a of the circuit pattern 23. Thus, the height H2 (see FIG. 19A) is smaller than the height H0 (see FIG. 14A) according to the comparative example. Thus, the rear surface of the coating layer 51 covering the cavity 27b formed in a side portion of the bonding material 27 is supported by the supporting portion 52. As a result, the coating layer 51 covering the opening area of the cavity 27b coats the circuit front surface 23f including the semiconductor chip 25, the side portions of the bonding material 27, and the supporting portion 52 in plan view of the circuit pattern 23, without being ripped. The coating layer 51 prevents the sealing material 40 from entering the cavity 27b. If the height H2 and the width W2 are too large, the cavity 27b could have a larger opening area exposed to the outside, and therefore, the coating layer 51 could be ripped. Thus, it is preferable that the height H2 be between 20% and 80%, inclusive, of the height from the circuit front surface 23f of the circuit pattern 23 to the front surface of the semiconductor chip 25. The height H2 may be between 10% and 120%, inclusive, of the thickness of the semiconductor chip 25. Preferably, the height H2 is between 50% and 100%, inclusive, of the thickness. If the supporting portion 52 is too far away from a side portion of the bonding material 27, the coating layer 51 could be ripped between the corresponding outer periphery portion of the semiconductor chip 25 and the supporting portion 52. Thus, the width W2 from the side portion of the bonding material 27 to the inner side of the supporting portion 52 is more than 0 mm and less than or equal to 0.5 mm, for example.

The adhesion of the sealing material 40 is improved by the coating layer 51, occurrence of peeling is prevented, and the inside of the storage portion 32 of the case 30 is sealed without fail. Since the sealing material 40 does not enter the cavity 27b, even when the temperature change occurs, stress that causes damage to the semiconductor chip 25 does not occur. Thus, deterioration of the reliability of the semiconductor device 10 is prevented.

Variation 2

Figure 23:
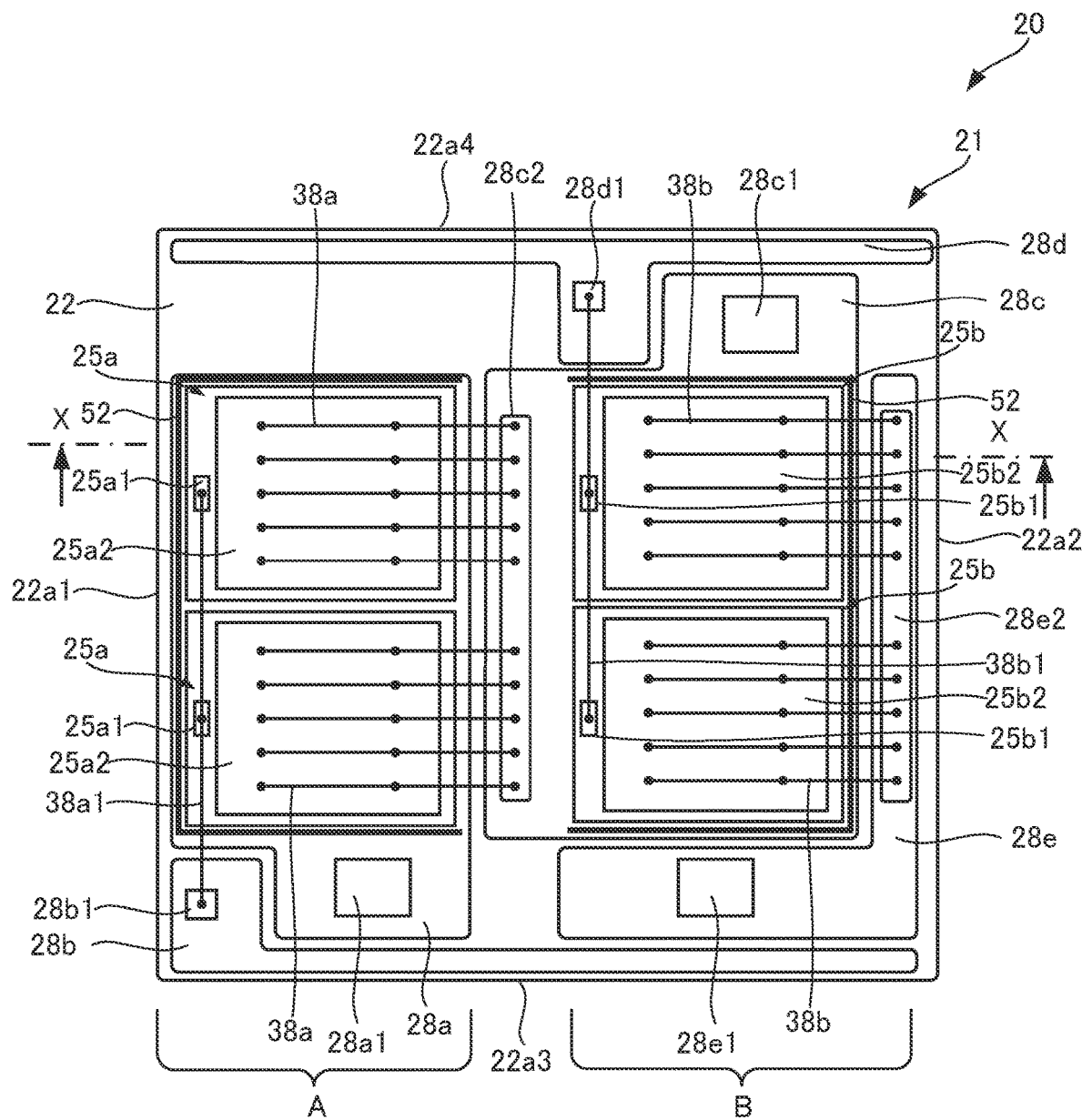
FIG. 23 is a plan view of a semiconductor unit included in a semiconductor device according to variation 2 of the second embodiment.
Figure 24:
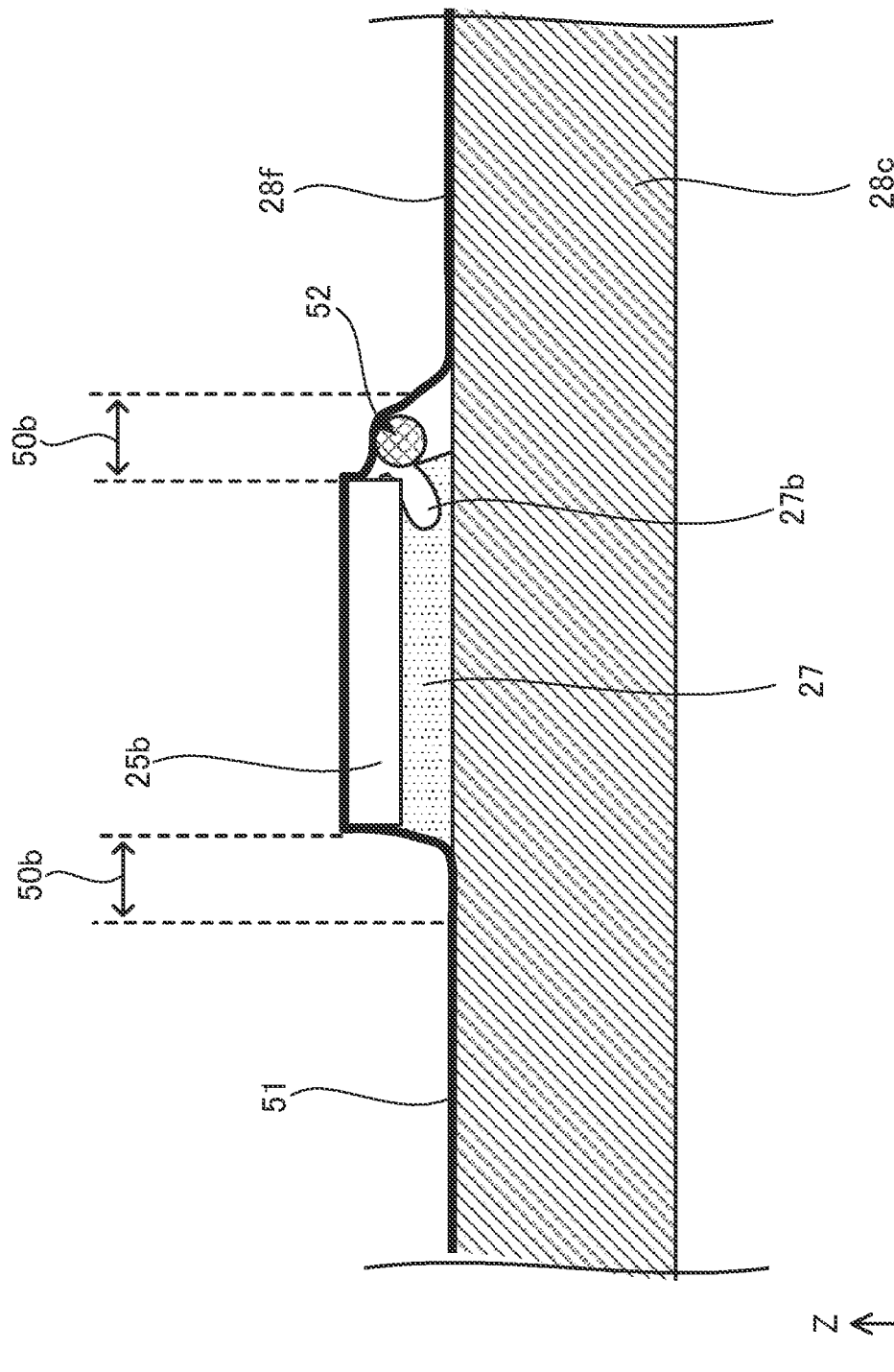
FIG. 24 illustrates a coating step included in a semiconductor device manufacturing method according to variation 2 of the second embodiment.

As described, a cavity 27b is easily formed in a side portion in the bonding material 27 bonding the semiconductor chip 25 to the insulating circuit board 21, the side portion facing an outer peripheral portion of the insulating circuit board 21. In addition, according to the second embodiment, a supporting portion 52 may be introduced in a desired area of the circuit pattern 23. Thus, a variation in which a supporting portion 52 is introduced to an area in which a cavity 27b is easily formed will be described with reference to FIGS. 23 and 24. FIG. 23 is a plan view of a semiconductor unit included in a semiconductor device according to variation 2 of the second embodiment. FIG. 24 illustrates a coating step included in a semiconductor device manufacturing method according to variation 2 of the second embodiment. FIG. 24 is a sectional view of a semiconductor chip 25b taken along a dashed-dotted line X-X in FIG. 23.

A semiconductor unit 20 includes upper and lower arm portions, specifically, an upper arm portion A and a lower arm portion B. In addition, the semiconductor unit 20 includes an insulating circuit board 21 and semiconductor chips 25a and 25b formed on the front surface of the insulating circuit board 21. In addition, the insulating circuit board 21 of the semiconductor unit 20 is disposed on a heat dissipation board (not illustrated) via solder, silver solder, or the like (not illustrated).

These semiconductor chips 25a and 25b also include RC-IGBTs as switching elements. Each of the semiconductor chips 25a and 25b also includes, on its rear surface, a collector electrode and an anode electrode as its main electrodes and includes, on its front surface, a control electrode 25a1 or 25b1 as its gate electrode and an emitter electrode as its main electrode 25a2 or 25b2 and a cathode electrode. The semiconductor chips 25a or 25b according to variation 2 each include the control electrode 25a1 or 25b1 in the center of an outer peripheral portion of its front surface and each include the main electrode 25a2 or 25b2 in the center of its front surface.

The insulating circuit board 21 includes an insulating plate 22 and a metal plate formed on the rear surface of the insulating plate 22. In addition, the insulating circuit board 21 includes circuit patterns 28a to 28e formed on the front surface of the insulating plate 22. When these circuit patterns 28a to 28e do not need to be distinguished from each other, any one of the circuit patterns 28a to 28e will be referred to as a circuit pattern 28.

The insulating plate 22, the metal plate, the circuit patterns 28a to 28e are each made of the same material as the insulating plate 22, the metal plate, the circuit patterns 23a to 23c, 23d1, 23d2, 23e1, 23e2 according to the first embodiment. In addition, bonding wires 38a, 38a1, 38b, and 38b1 are also made of the same material as that of the bonding wires 38 according to the first embodiment. The insulating plate 22 according to the variation 2 has a rectangular shape in plan view and has, as its outer peripheral sides, a pair of long sides 22a1 and 22a2 facing each other and a pair of short sides 22a3 and 22a4 facing each other.

The circuit pattern 28a constitutes a collector pattern of the upper arm portion A. The collector electrodes formed on the rear surfaces of the semiconductor chips 25a are bonded to the circuit pattern 28a via bonding material (not illustrated). The circuit pattern 28a has an approximately rectangular shape and has a protruding portion including a contact area 28a1 in a lower portion in FIG. 23. On this circuit pattern 28a, the semiconductor chips 25a are disposed via bonding material such that the control electrodes 25a1 are arranged in a line. The semiconductor chips 25a are disposed such that the control electrodes 25a1 face one side parallel to the arrangement direction of the semiconductor chips 25a. The control electrodes 25a1 face the long side 22a1 of the insulating plate 22. The number of semiconductor chips 25a may be three or more. In this case, too, the semiconductor chips 25a are disposed such that the control electrodes 25a1 are arranged in a line and face one side parallel to the arrangement direction of the semiconductor chips 25a.

The circuit pattern 28b constitutes a control pattern of the upper arm portion A. The circuit pattern 28b is connected to the bonding wire 38a1 connected to the control electrodes 25a1 of the semiconductor chips 25a. The circuit pattern 28b includes a connection area 28b1 located on the same line with the control electrodes 25a1 of the semiconductor chips 25a. In FIG. 23, a portion of the circuit pattern 28b includes the connection area 28b1, and from this portion, the circuit pattern 28b extends perpendicularly to the arrangement direction of the semiconductor chips 25a along the short side 22a3 of the insulating plate 22.

The circuit pattern 28c constitutes an emitter pattern of the upper arm portion A and a collector pattern of the lower arm portion B. The circuit pattern 28c is connected to the bonding wires 38a connected to the main electrodes 25a2 (emitter electrodes) of the semiconductor chips 25a. In addition, the circuit pattern 28c is connected to the main electrodes (collector electrodes) formed on the rear surfaces of the semiconductor chips 25*b* via bonding material (not illustrated). The circuit pattern 28*c* has an approximately rectangular shape and has a protruding portion including a contact area 28*c*1 in an upper portion in FIG. 23. The circuit pattern 28*c* is disposed beside the circuit pattern 28*a* in the opposite direction to the control electrode 25*a*1 (in the +Y direction). The circuit pattern 28*c* has a connection area 28*c*2 that extends in parallel to the arrangement of the semiconductor chips 25*b* and that are connected to the bonding wires 38*a*. The semiconductor chips 25*b* are disposed on the circuit pattern 28*c* via bonding material (not illustrated) such that the control electrodes 25*b*1 are arranged in a line. The semiconductor chips 25*b* are disposed such that the control electrodes 25*b*1 face one side parallel to the arrangement direction of the semiconductor chips 25*b*. The arrangement of the control electrodes 25*b*1 may be parallel to the arrangement of the control electrodes 25*a*1 of the upper arm portion A. The control electrodes 25*b*1 face the upper arm portion A (the long side 22*a*1 of the insulating plate 22). The number of semiconductor chips 25*b* may be three or more. In this case, too, the semiconductor chips 25*b* are disposed such that the control electrodes 25*b*1 are arranged in a line and face one side parallel to the arrangement direction of the semiconductor chips 25*b*.

The circuit pattern 28*d* constitutes a control pattern of the lower arm portion B. The circuit pattern 28*d* is connected to the bonding wire 38*b*1 connected to the control electrodes 25*b*1 of the semiconductor chips 25*b*. The circuit pattern 28*d* has a connection area 28*d*1 located on the same line with the control electrodes 25*b*1 of the semiconductor chips 25*b* and in the opposite direction to the connection area 28*b*1 via the semiconductor chips 25*a* and 25*b*. In FIG. 23, from the portion including the connection area 28*d*1, the circuit pattern 28*d* extends perpendicularly to the arrangement direction of the semiconductor chips 25*b* along the short side 22*a*4 of the insulating plate 22.

The circuit pattern 28*e* constitutes an emitter pattern of the lower arm portion B. The circuit pattern 28*e* has a connection area 28*e*2 connected to the bonding wires 38*b* connected to the main electrodes 25*b*2 (emitter electrodes) of the semiconductor chips 25*b*. The circuit pattern 28*e* has the connection area 28*e*2 located beside the circuit pattern 28*c* and in the opposite direction to the control electrodes 25*b*1 (in the +Y direction). Thus, the circuit pattern 28*e* has a portion disposed in the opposite direction to the circuit pattern 28*a* via the circuit pattern 28*c*. The circuit pattern 28*e* has an L shape formed by two orthogonal portions between two orthogonal sides of the circuit pattern 28*c* and the long side 22*a*2 and the short side 22*a*3 of the insulating plate 22. The circuit pattern 28*e* has the connection area 28*e*2 in the portion extending in the +Y direction of the insulating plate 22 and has a contact area 28*e*1 in the portion extending in the −X direction of the insulating plate 22.

As in the case in FIG. 13, a cavity 27*b* is easily formed in a side portion of any one of the four bonding materials on the insulating circuit board 21, the side portion facing an outer periphery portion of the insulating circuit board 21. Thus, on the insulating circuit board 21 according to variation 2, as illustrated in FIG. 23, supporting portions 52 are each formed near at least one side portion of the bonding material (under the semiconductor chips 25*a* and 25*b*), the side portion facing an outer periphery portion of the insulating circuit board 21. That is, a supporting portion 52 is formed near the semiconductor chips 25*a* on the circuit pattern 28*a* along the long side 22*a*1 and the short sides 22*a*3 and 23*a*4 of the insulating plate 22. In addition, a supporting portion 52 is formed near the semiconductor chips 25*b* on the circuit pattern 28*c* along the long side 22*a*2 and the short sides 22*a*3 and 23*a*4 of the insulating plate 22. The supporting portion 52 along the long side 22*a*1 is continuously formed along side portions of the two semiconductor chips 25*a*. The supporting portion 52 along the long side 22*a*2 is continuously formed along side portions of the two semiconductor chips 25*b*. The supporting portions 52 are each formed near side portions of the bonding materials that face outer peripheral portions of the insulating circuit board 21. The supporting portions 52 are formed in the same way as described in the second embodiment.

The insulating circuit board 21 on which the supporting portions 52 are formed is coated with a coating layer 51. For example, as illustrated in FIG. 24, a supporting portion 52 is formed near a side portion of the bonding material 27 under a semiconductor chip 25*b*, the side portion including a cavity 27*b*. The semiconductor chip 25*b* and the circuit front surface 28*f* of the circuit pattern 28*c* including the supporting portion 52 in the surrounding area 50*b* are coated with the coating layer 51. The coating layer 51 covers a side portion of the bonding material 27 between an outer peripheral portion of the semiconductor chip 25*b* (beside which the supporting portion 52 is not formed) and the corresponding surrounding area on the circuit front surface 28*f*.

On the other side, the coating layer 51 is supported by the supporting portion 52 between an outer periphery portion of the semiconductor chip 25*b* (beside which the supporting portion 52 is formed) and the circuit front surface 28*f*. Thus, the coating layer 51 gradually covers the gap between the outer periphery portion of the semiconductor chip 25 and the circuit front surface 28*f*. Thus, a void is included between the coating layer 51 and the bonding material 27. The coating layer 51 covers the opening of the cavity 27*b* in the side portion of the bonding material 27. The insulating circuit board 21 coated with the coating layer 51 is sealed with sealing material. In this case, the sealing material is prevented from entering the cavity 27*b*.

There is a case in which an electrically conductive external connection terminal is bonded to the circuit pattern 23 via bonding material 27. In this case, too, since a cavity 27*b* is formed in the bonding material 27, any one of the above embodiments and variation 2 may be applied to the external connection terminal, in place of the semiconductor chip 25. However, when the external connection terminal is bonded to the circuit pattern 23 via the bonding material 27, it is possible to reduce or eliminate the cavity 27*b* in the bonding material 27 by pressing the external connection terminal against the circuit pattern 23. Thus, the above embodiments and variation 2 are more suitably applied to the semiconductor chip 25.

The above semiconductor device manufacturing method and semiconductor device prevent sealing material from entering a cavity and prevent deterioration of the reliability.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device manufacturing method, comprising:
preparing a semiconductor chip and a conductive plate having a front surface that includes a disposition area on which the semiconductor chip is to be disposed;
forming a supporting portion so as to surround an entire periphery of the disposition area of the conductive plate such that a highest point of the supporting portion is located at a level higher than a level of a bottom of the disposition area in an upward direction orthogonal to the front surface of the conductive plate;
bonding the semiconductor chip to the disposition area via bonding material applied to the disposition area;
entirely coating the front surface of the conductive plate, including the semiconductor chip and the supporting portion, with a coating layer; and
after the coating, sealing the front surface of the conductive plate, including the semiconductor chip and the supporting portion, with sealing material.

2. The semiconductor device manufacturing method according to claim 1, wherein
the preparing includes forming the conductive plate on a multi-layer board having a flat plate shape, in an area adjacent to a part of an outer periphery of the multi-layer board,
the disposition area is set on the conductive plate in an area adjacent to the part of the outer periphery of the multi-layer board, and
the supporting portion is provided in a portion of the periphery of the disposition area, the portion of the periphery of the disposition area facing the part of the outer periphery of the multi-layer board.

3. The semiconductor device manufacturing method according to claim 1, wherein the supporting portion is continuously formed to surround an entire disposition area.

4. The semiconductor device manufacturing method according to claim 1, wherein the coating is performed under coating pressure, and the sealing is performed under sealing pressure that is lower than the coating pressure.

5. The semiconductor device manufacturing method according to claim 4, wherein the coating pressure is in a range of $0.5 \times 10^5$ Pa to $1.5 \times 10^5$ Pa.

6. The semiconductor device manufacturing method according to claim 4, wherein the sealing pressure is a range of $1.0 \times 10^3$ Pa to $1.0 \times 10^4$ Pa.

7. The semiconductor device manufacturing method according to claim 1, wherein
the forming includes forming a concave portion in the disposition area such that a bottom of the concave portion has a level lower in the upward direction than is a level of the front surface of the conductive plate, and
the bonding includes applying the bonding material to the concave portion to bond the semiconductor chip to the concave portion via the bonding material.

8. The semiconductor device manufacturing method according to claim 1, wherein
the forming includes forming the supporting portion in the periphery of the disposition area such that the highest point of the supporting portion in the upward direction is located at a level higher than is a level of the front surface of the conductive plate, and
the bonding includes applying the bonding material to the disposition area to bond the semiconductor chip to the disposition area via the bonding material.

9. The semiconductor device manufacturing method according to claim 8, wherein the supporting portion is a wire extending in the periphery along the disposition area or is resist material applied to the periphery along the disposition area.

10. The semiconductor device manufacturing method according to claim 1, wherein a chip front surface of the semiconductor chip bonded by the bonding is located at a level higher than the highest point of the supporting portion in the upward direction.

11. The semiconductor device manufacturing method according to claim 1, wherein the coating layer is made of thermosetting resin as a main component thereof, and the thermosetting resin is polyamide resin, polyamide imide resin, or polyetherimide resin.

12. The semiconductor device manufacturing method according to claim 1, wherein a void is included between the bonding material and the coating layer.

13. A semiconductor device, comprising:
a semiconductor chip;
a conductive plate having a front surface that includes a disposition area to which the semiconductor chip is bonded via a bonding material, the conductive plate including a supporting portion that surrounds an entire periphery of the disposition area, a highest point of the support portion being located at a level higher than a level of a bottom of the disposition area in an upward direction orthogonal to the front surface of the conductive plate;
a coating layer that entirely covers the front surface of the conductive plate, including the semiconductor chip and the supporting portion; and
sealing material that seals the front surface of the conductive plate coated with the coating layer.

14. The semiconductor device according to claim 13, wherein in the upward direction, the supporting portion is disposed away from the front surface so that a lowest point of the supporting portion is at a level higher than the level of the front surface.

15. The semiconductor device according to claim 14, wherein the disposition area of the conductive plate is concave, and a bottom of the disposition area is located at a level lower than is the highest point of the supporting portion in the upward direction.

16. The semiconductor device according to claim 14, wherein
the highest point of the supporting portion of the conductive plate is located at a level higher than a level of the front surface in the upward direction, and
the semiconductor chip is bonded to the disposition area via the bonding material.

17. The semiconductor device according to claim 16, wherein the supporting portion is a wire extending in the periphery along the disposition area or is resist material applied to the periphery along the disposition area.

18. The semiconductor device according to claim 16, wherein a void is included in the bonding material at a side portion thereof, between the front surface of the conductive plate and the coating layer.

19. The semiconductor device according to claim 14, wherein a chip front surface of the semiconductor chip is located at a level higher than the highest point of the supporting portion in the upward direction.

20. The semiconductor device according to claim 14, wherein the coating layer is made of thermosetting resin as a main component thereof, and the thermosetting resin is polyamide resin, polyamide imide resin, or polyetherimide resin.

21. The semiconductor device according to claim 14, further comprising a multi-layer board including a flat board having a flat plate shape and the conductive plate, the conductive plate being provided on a front surface of the flat board in an area adjacent to a part of an outer periphery of the flat board, wherein
- the disposition area is set on the front surface of the conductive plate in an area adjacent to the part of the outer periphery of the flat board, and
- the supporting portion is provided in a portion of the periphery of the disposition area, the portion of the periphery of the disposition area facing the part of the outer periphery of the flat board.

\* \* \* \* \*